US012706598B2

(12) United States Patent
Tanaka et al.

(10) Patent No.: US 12,706,598 B2
(45) Date of Patent: Aug. 11, 2026

(54) PULSE DRIVE CIRCUIT AND SIGNAL TRANSMISSION DEVICE

(71) Applicant: ROHM CO., LTD., Kyoto (JP)

(72) Inventors: Sho Tanaka, Kyoto (JP); Shimpei Kitera, Kyoto (JP); Hiroki Tsukamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 18/894,333

(22) Filed: Sep. 24, 2024

(65) Prior Publication Data

US 2025/0015787 A1 Jan. 9, 2025

Related U.S. Application Data

(63) Continuation of application No. PCT/JP2023/008038, filed on Mar. 3, 2023.

(30) Foreign Application Priority Data

Mar. 28, 2022 (JP) ................................ 2022-051347
Mar. 28, 2022 (JP) ................................ 2022-051351
Mar. 28, 2022 (JP) ................................ 2022-051354

(51) Int. Cl.
*H03K 5/04* (2006.01)
*H04L 25/03* (2006.01)

(52) U.S. Cl.
CPC ......... *H03K 5/04* (2013.01); *H04L 25/03834* (2013.01)

(58) Field of Classification Search
CPC .... H03K 5/04; H03K 17/691; H03K 19/0175; H03K 17/689; H03K 19/017509; H04L 25/03834; H04L 25/02; H10D 84/00; H10D 84/038
See application file for complete search history.

(56) References Cited

U.S. PATENT DOCUMENTS 3,930,171 A * 12/1975 Takahashi .............. H03K 17/64 327/110

FOREIGN PATENT DOCUMENTS

| | | |
|---|---|---|
| CN | 1901373 | 1/2007 |
| JP | 2006-352782 | 12/2006 |
| JP | 2017-188903 | 10/2017 |

OTHER PUBLICATIONS

International Search Report and Written Opinion in International Appln. No. PCT/JP2023/008038, mailed on May 23, 2023, 13 pages (with machine translation).

* cited by examiner

*Primary Examiner* — Jung Kim
(74) *Attorney, Agent, or Firm* — Fish & Richardson P.C.

(57) ABSTRACT

A pulse drive circuit includes: a buffer configured to receive a transmission pulse signal; a capacitor configured to be provided between the output terminal of the buffer and the primary coil of a transformer; and a first diode configured to be provided between the primary coil of the transformer and a reference potential terminal.

4 Claims, 21 Drawing Sheets

PULSE DRIVE CIRCUIT AND SIGNAL TRANSMISSION DEVICE

CROSS-REFERENCE TO RELATED APPLICATIONS

This nonprovisional application is a continuation application of International Patent Application No. PCT/JP2023/008038 filed on Mar. 3, 2023, which claims priority to Japanese Patent Applications No. 2022-051347, 2022-051351 and 2022-051354, all of which filed on Mar. 28, 2022, the entire contents of which are hereby incorporated by reference.

TECHNICAL FIELD

The present disclosure relates to a pulse drive circuit and a signal transmission device employing a pulse drive circuit.

BACKGROUND ART

Signal transmission devices that transmit a pulse signal while isolating between input and output are conventionally used in a variety of applications (such as power supply devices and motor driving devices).

One example of technologies related to what has just been mentioned is seen in Patent Document 1 identified below.

CITATION LIST

Patent Literature

Patent Document 1: JP-A-2017-188903

DESCRIPTION OF EMBODIMENTS

<Signal Transmission Device (Basic Configuration)>

Figure 1:
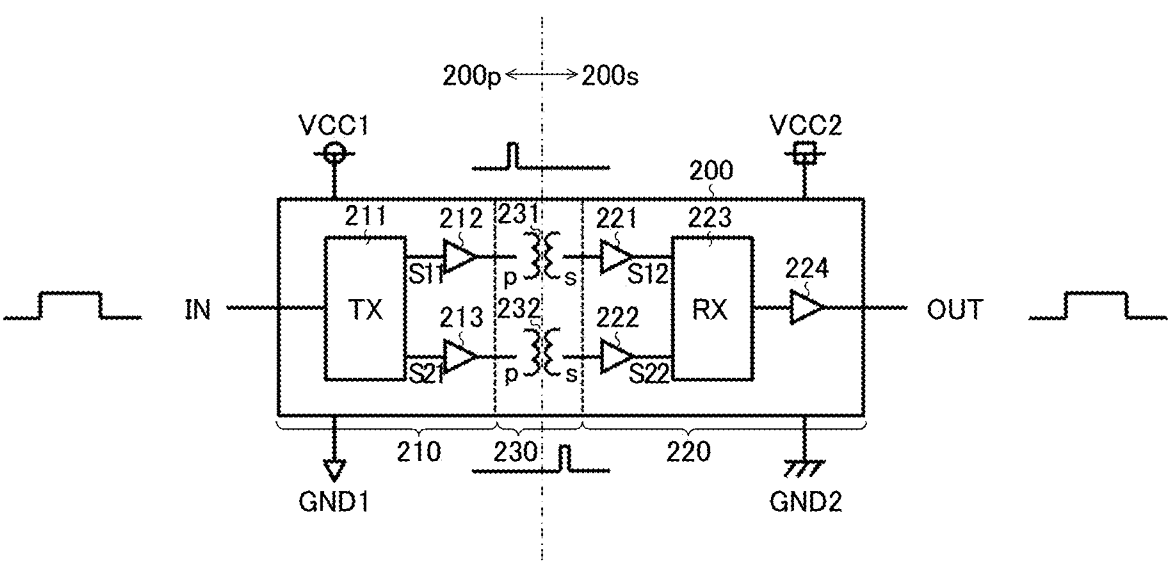
FIG. 1 is a diagram illustrating the basic configuration of a signal transmission device.

FIG. 1 is a diagram illustrating the basic configuration of a signal transmission device. The signal transmission device 200 of this configuration example is a semiconductor integrated circuit device (what is generally called an isolated gate driver IC) that, while isolating between a primary circuit system 200*p* (VCC1-GND1 system) and a secondary circuit system 200*s* (VCC2-GND2 system), transmits a pulse signal from the primary circuit system 200*p* to the secondary circuit system 200*s* to drive the gate of a switching device (unillustrated) provided in the secondary circuit system 200*s*. The signal transmission device 200 has, for example, a controller chip 210, a driver chip 220, and a transformer chip 230 sealed in a single package.

The controller chip 210 is a semiconductor chip that operates by being supplied with a supply voltage VCC1 (e.g., seven volts at the maximum with respect to GND1). The controller chip 210 has, for example, a pulse transmission circuit 211 and buffers 212 and 213 integrated in it.

The pulse transmission circuit 211 is a pulse generator that generates transmission pulse signals S11 and S21 according to an input pulse signal IN. More specifically, when indicating that the input pulse signal IN is at high level, the pulse transmission circuit 211 pulse-drives (outputs a single or a plurality of pulses in) the transmission pulse signal S11; when indicating that the input pulse signal IN is at low level, the pulse transmission circuit 211 pulse-drives the transmission pulse signal S21. That is, the pulse transmission circuit 211 pulse-drives either the transmission pulse signal S11 or S21 according to the logic level of the input pulse signal IN.

The buffer 212 receives the transmission pulse signal S11 from the pulse transmission circuit 211, and pulse-drives the transformer chip 230 (more specifically, a transformer 231).

The buffer 213 receives the transmission pulse signal S21 from the pulse transmission circuit 211, and pulse-drives the transformer chip 230 (more specifically, a transformer 232).

The driver chip 220 is a semiconductor chip that operates by being supplied with a supply voltage VCC2 (e.g., 30 volts at the maximum with respect to GND2). The driver chip 220 has, for example, buffers 221 and 222, a pulse reception circuit 223, and a driver 224 integrated in it.

The buffer 221 performs waveform shaping on a reception pulse signal S12 induced in the transformer chip 230 (specifically, the transformer 231), and outputs the result to the pulse reception circuit 223.

The buffer 222 performs waveform shaping on a reception pulse signal S22 induced in the transformer chip 230 (specifically, the transformer 232), and outputs the result to the pulse reception circuit 223.

According to the reception pulse signals S12 and S22 fed to it via the buffers 221 and 222, the pulse reception circuit 223 drivers the driver 224 to generate an output pulse signal OUT. More specifically, the pulse reception circuit 223 drives the driver 224 to raise the output pulse signal OUT to high level in response to the reception pulse signal S12 being pulse-driven and to drop the output pulse signal OUT to low level in response to the reception pulse signal S22 being pulse-driven. That is, the pulse reception circuit 223 switches the logic level of the output pulse signal OUT according to the logic level of the input pulse signal IN. As the pulse reception circuit 223, for example, an RS flip-flop can be suitably used.

The driver 224 generates the output pulse signal OUT under the driving and control of the pulse reception circuit 223.

The transformer chip 230, while isolating between the controller chip 210 and the driver chip 220 on a direct-current basis using the transformers 231 and 232, outputs the transmission pulse signals S11 and S21 fed to the transformer chip 230 from the pulse transmission circuit 211 to, as the reception pulse signals S12 and S22, the pulse reception circuit 223. In the present description, "isolating on a direct-current basis" means leaving two elements to be isolated from each other unconnected by a conductor.

More specifically, the transformer 231 outputs, according to the transmission pulse signal S11 fed to the primary coil 231*p*, the reception pulse signal S12 from the secondary coil 231*s*. Likewise, the transformer 232 outputs, according to the transmission pulse signal S21 fed to the primary coil 232*p*, the reception pulse signal S22 from the secondary coil 232*s*.

In this way, owing to the characteristics of spiral coils used in isolated communication, the input pulse signal IN is split into two transmission pulse signals S11 and S21 (corresponding to a rise signal and a fall signal) to be transmitted via the two transformers 231 and 232 from the primary circuit system 200*p* to the secondary circuit system 200*s*.

Note that the signal transmission device 200 of this configuration example has, separately from the controller chip 210 and the driver chip 220, the transformer chip 230 that incorporates the transformers 231 and 232 alone, and those three chips are sealed in a single package.

With this configuration, the controller chip 210 and the driver chip 220 can each be formed by a common low- to middle-withstand-voltage process (with a withstand voltage of several volts to several tens of volts). This eliminates the need for a dedicated high-withstand-voltage process (with a withstand voltage of several kilovolts), and helps reduce manufacturing costs.

The signal transmission device 200 can be employed suitably, for example, in a power supply device or motor driving device in a vehicle-mounted device incorporated in a vehicle. Such a vehicle can be an engine vehicle or an electric vehicle (an xEV such as a BEV [battery electric vehicle], HEV [hybrid electric vehicle], PHEV/PHV [plug-in hybrid electric vehicle/plug-in hybrid vehicle], or FCEV/FCV [fuel cell electric vehicle/fuel cell vehicle]).

<Transformer Chip (Basic Structure)>

Figure 2:
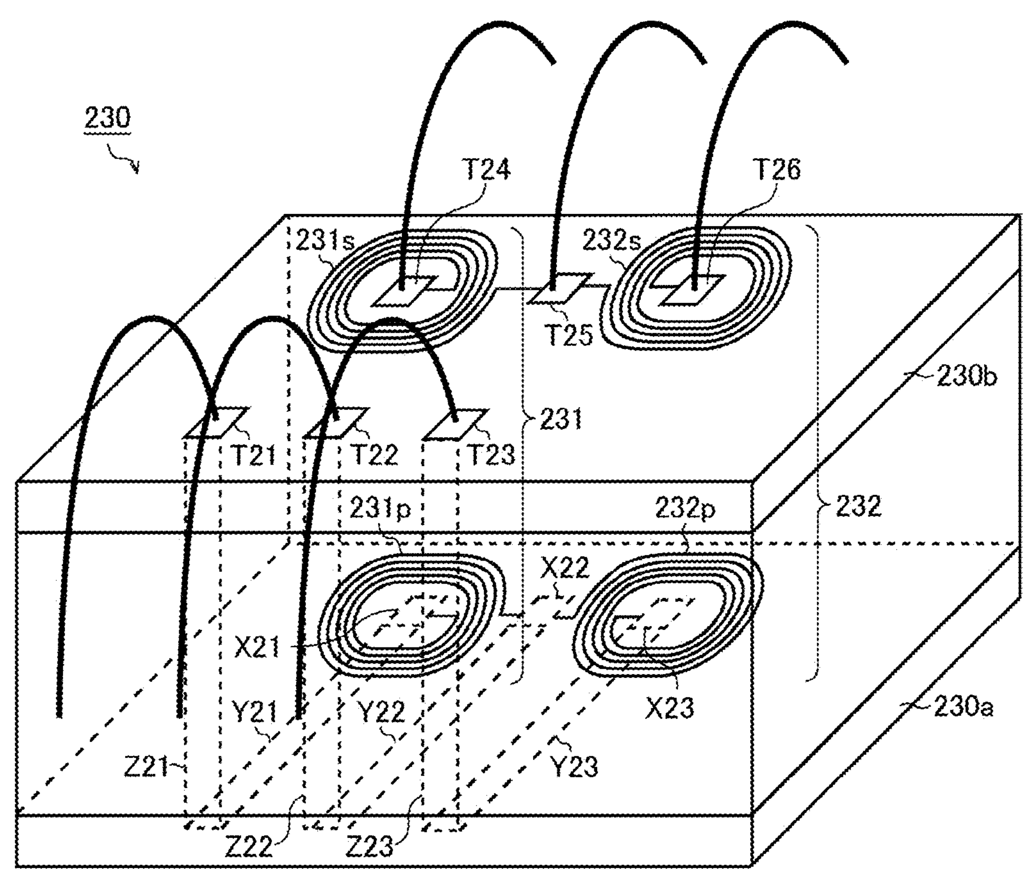
FIG. 2 is a diagram illustrating the basic structure of a transformer chip.

Next, the basic structure of the transformer chip 230 will be described. FIG. 2 is a diagram showing the basic structure of the transformer chip 230. In the transformer chip 230 shown there, the transformer 231 includes a primary coil 231*p* and a secondary coil 231*s* that face each other in the up-down direction; the transformer 232 includes a primary coil 232*p* and a secondary coil 232*s* that face each other in the up-down direction.

The primary coils 231*p* and 232*p* are both formed in a first wiring layer (lower layer) 230*a* in the transformer chip 230. The secondary coils 231*s* and 231*s* are both formed in a second wiring layer (the upper layer in the diagram) 230*b* in the transformer chip 230. The secondary coil 231*s* is disposed right above the primary coil 231*p* and faces the primary coil 231*p*; the secondary coil 232*s* is disposed right above the primary coil 232*p* and faces the primary coil 232*p*.

The primary coil 231*p* is laid in a spiral shape so as to encircle an internal terminal X21 clockwise, starting at the first terminal of the primary coil 231*p*, which is connected to the internal terminal X21. The second terminal of the primary coil 231*p*, which corresponds to its end point, is connected to an internal terminal X22. Likewise, the primary coil 232*p* is laid in a spiral shape so as to encircle an internal terminal X23 anticlockwise, starting at the first terminal of the primary coil 232*p*, which is connected to the internal terminal X23. The second terminal of the primary coil 232*p*, which corresponds to its end point, is connected to the internal terminal X22. The internal terminals X21, X22, and X23 are arrayed on a straight line in the illustrated order.

The internal terminal X21 is connected, via a wiring Y21 and a via Z21 both conductive, to an external terminal T21 in the second layer 230*b*. The internal terminal X22 is connected, via a wiring Y22 and a via Z22 both conductive, to an external terminal T22 in the second layer 230*b*. The internal terminal X23 is connected, via a wiring Y23 and a via Z23 both conductive, to an external terminal T23 in the second layer 230*b*. The external terminals T21 to T23 are disposed in a straight row and are used for wire-bonding with the controller chip 210.

The secondary coil 231*s* is laid in a spiral shape so as to encircle an external terminal T24 anticlockwise, starting at the first terminal of the secondary coil 231*s*, which is connected to the external terminal T24. The second terminal of the secondary coil 231*s*, which corresponds to its end point, is connected to an external terminal T25. Likewise, the secondary coil 232*s* is laid in a spiral shape so as to encircle an external terminal T26 clockwise, starting at the first terminal of the secondary coil 232*s*, which is connected to the external terminal T26. The second terminal of the secondary coil 232*s*, which corresponds to its end point, is connected to the external terminal T25. The external terminals T24, T25, and T26 are disposed in a straight row in the illustrated order and are used for wire-bonding with the driver chip 220.

The secondary coils 231*s* and 232*s* are AC-connected to the primary coils 231*p* and 232*p*, respectively, by magnetic coupling, and are DC-isolated from the primary coils 231*p* and 232*p*. That is, the driver chip 220 is AC-connected to the controller chip 210 via the transformer chip 230, and is DC-isolated from the controller chip 210 by the transformer chip 230.

<Transformer Chip (Two-Channel Type)>

Figure 3:
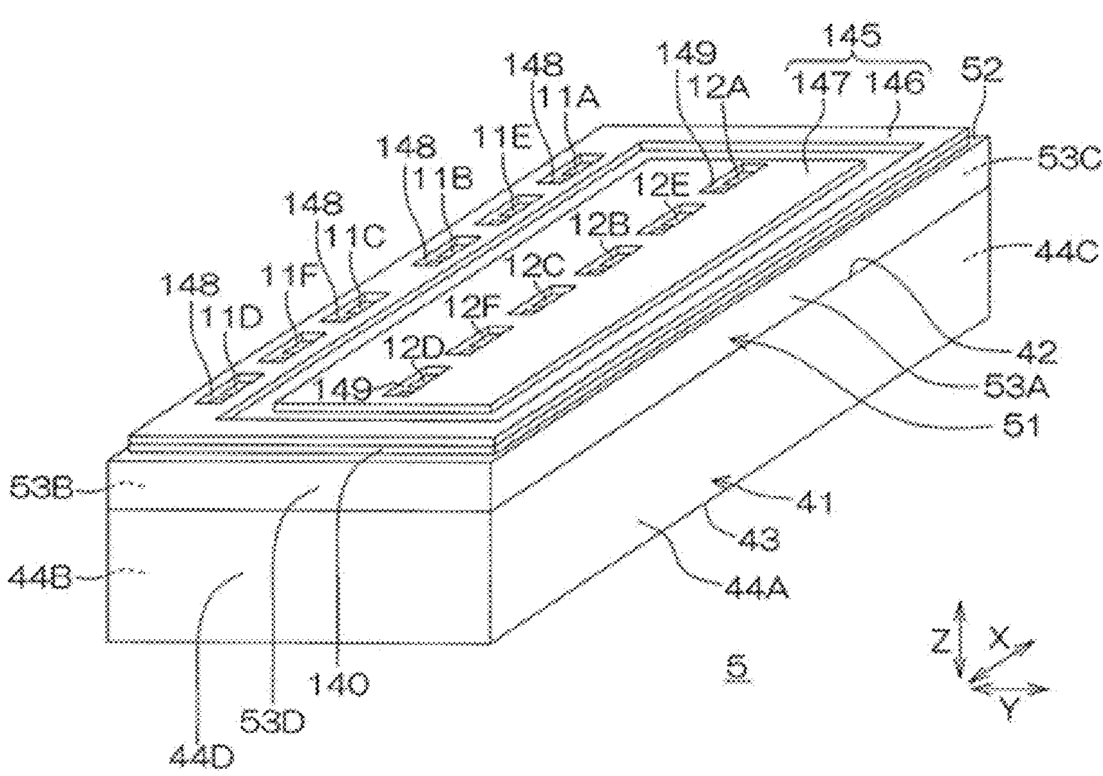
FIG. 3 a perspective view of a semiconductor device used as a two-channel transformer chip.
Figure 4:
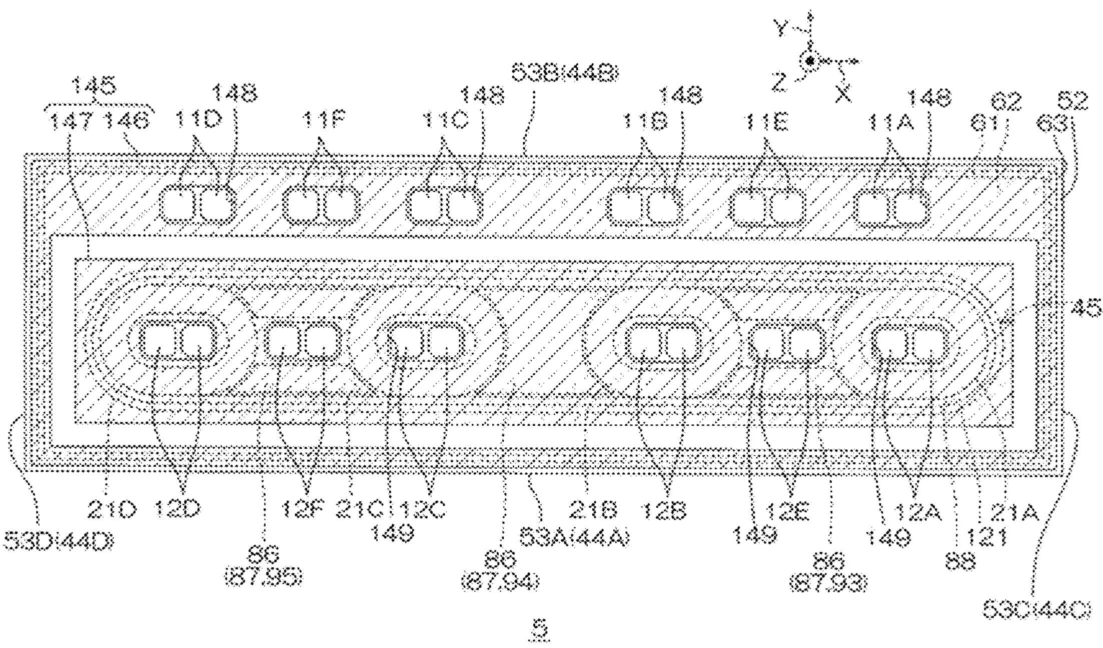
FIG. 4 is a plan view of the semiconductor device shown in FIG. 3.
Figure 5:
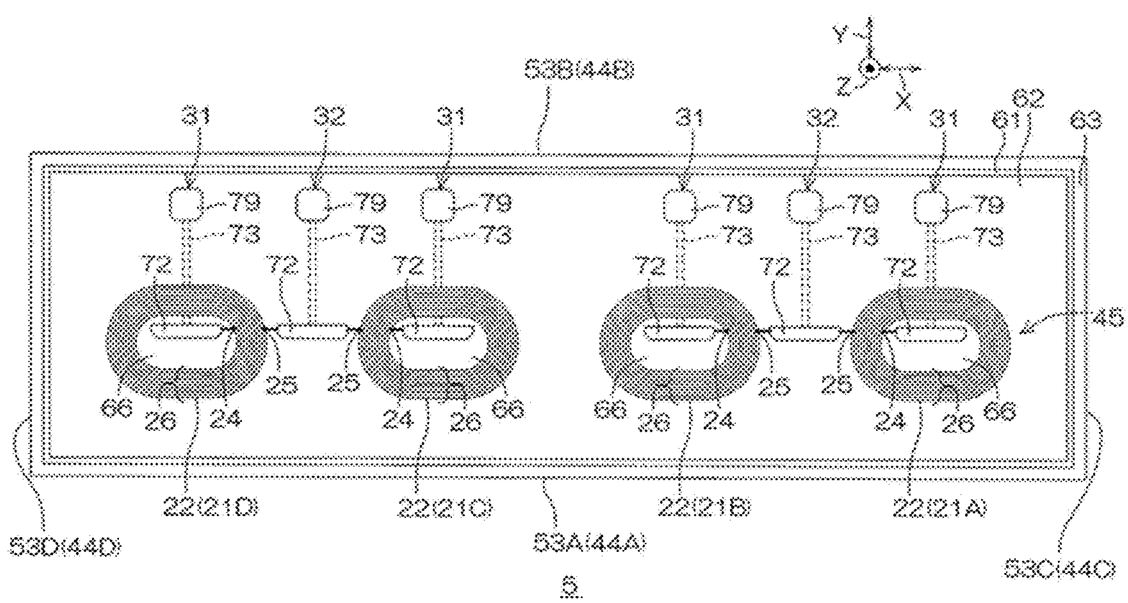
FIG. 5 is a plan view of a layer in the semiconductor device shown in FIG. 3 where low-potential coils are formed.
Figure 6:
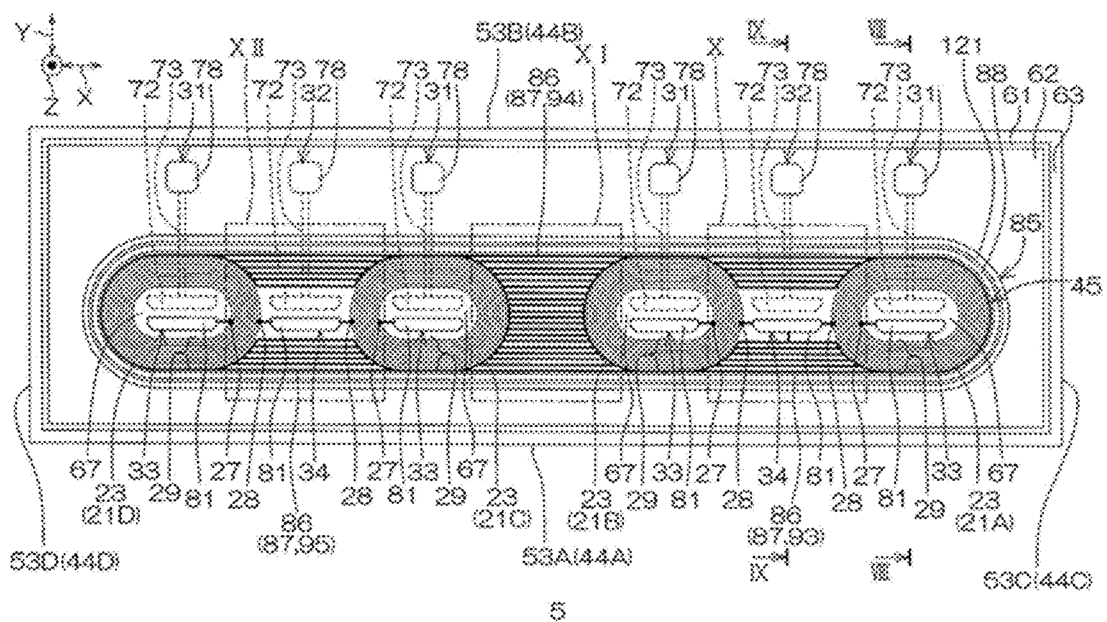
FIG. 6 is a plan view of a layer in the semiconductor device shown in FIG. 3 where high-potential coils are formed.
Figure 7:
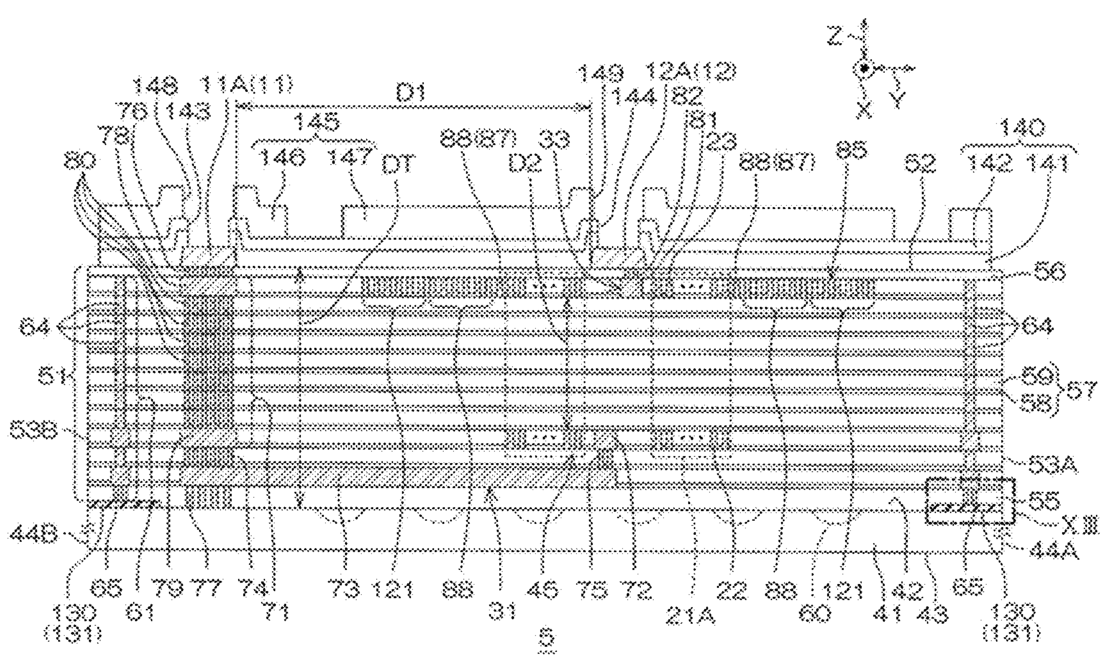
FIG. 7 is a cross-sectional view taken along line VIII-VIII shown in FIG. 6.
Figure 8:
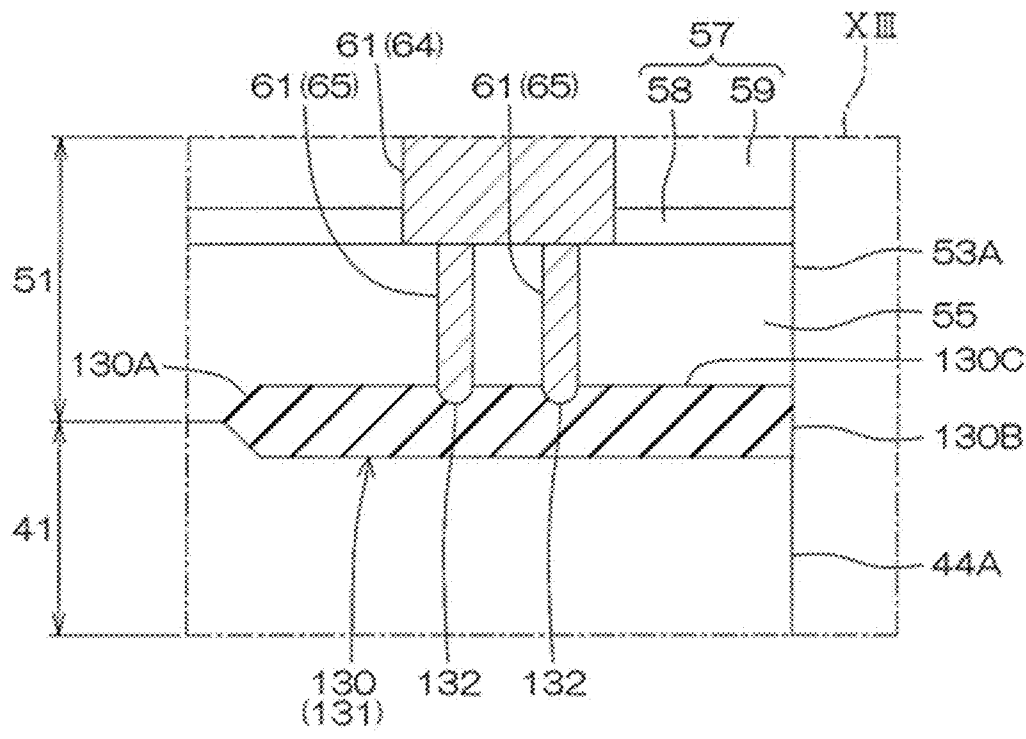
FIG. 8 is an enlarged view (showing a separation structure) of region XIII shown in FIG. 7.

FIG. 3 is a perspective view of a semiconductor device 5 used as a two-channel transformer chip. FIG. 4 is a plan view of the semiconductor device 5 shown in FIG. 3. FIG. 5 is a plan view showing a layer in the semiconductor device 5 shown in FIG. 3 where low-potential coils 22 (corresponding to the primary coils of transformers) are formed. FIG. 6 is a plan view showing a layer in the semiconductor device 5 shown in FIG. 3 where high-potential coils 23 (corresponding to the secondary coils of transformers) are formed. FIG. 7 is a sectional view along line VIII-VIII shown in FIG. 6. FIG. 8 is an enlarged view of region XIII shown in FIG. 7, showing a separation structure 130.

Referring to FIGS. 3 to 7, the semiconductor device 5 includes a semiconductor chip 41 in the shape of a rectangular parallelepiped. The semiconductor chip 41 contains at least one of silicon, a wide band gap semiconductor, and a compound semiconductor.

The wide band gap semiconductor is a semiconductor with a band gap larger than that of silicon (about 1.12 eV). Preferably, the wide band gap semiconductor has a band gap of 2.0 eV or more. The wide band gap semiconductor can be SiC (silicon carbide). The compound semiconductor can be a III-V group compound semiconductor. The compound semiconductor can contain at least one of aluminum nitride (AlN), indium nitride (InN), gallium nitride (GaN), and gallium arsenide (GaAs).

In the embodiment, the semiconductor chip 41 includes a semiconductor substrate made of silicon. The semiconductor chip 41 can be an epitaxial substrate that has a stacked structure composed of a semiconductor substrate made of silicon and an epitaxial layer made of silicon. The semiconductor substrate can be of an n-type or p-type conductivity. The epitaxial layer can be of an n-type or p-type.

The semiconductor chip 41 has a first principal surface 42 at one side, a second principal surface 43 at the other side, and chip side walls 44A to 44D that connect the first and second principal surfaces 42 and 43 together. As seen in a plan view from the normal direction Z to them (hereinafter simply expressed as "as seen in a plan view"), the first and second principal surfaces 42 and 43 are each formed in a quadrangular shape (in the embodiment, in a rectangular shape).

The chip side walls 44A to 44D includes a first chip side wall 44A, a second chip side wall 44B, a third chip side wall 44C, and a fourth chip side wall 44D. The first and second chip side walls 44A and 44B constitute the longer sides of the semiconductor chip 41. The first and second chip side walls 44A and 44B extend along a first direction X and face away from each other in a second direction Y. The third and fourth chip side walls 44C and 44D constitute the shorter sides of the semiconductor chip 41. The third and fourth chip side walls 44C and 44D extend in the second direction Y and face away from each other in the first direction X. The chip side walls 44A to 44D have polished surfaces.

The semiconductor device 5 further includes an insulation layer 51 formed on the first principal surface 42 of the semiconductor chip 41. The insulation layer 51 has an insulation principal surface 52 and insulation side walls 53A to 53D. The insulation principal surface 52 is formed in a quadrangular shape (in the embodiment, a rectangular shape) that fits the first principal surface 42 as seen in a plan view. The insulation principal surface 52 extends parallel to the first principal surface 42.

The insulation side walls 53A to 53D include a first insulation side wall 53A, a second insulation side wall 53B, a third insulation side wall 53C, and a fourth insulation side wall 53D. The insulation side walls 53A to 53D extend from the circumferential edge of the insulation principal surface 52 toward the semiconductor chip 41, and are continuous with the chip side walls 44A to 44D. Specifically, the insulation side walls 53A to 53D are formed to be flush with the chip side walls 44A to 44D. The insulation side walls 53A to 53D constitute polished surfaces that are flush with the chip side walls 44A to 44D.

The insulation layer 51 has a stacked structure of multilayer insulation layers that include a bottom insulation layer 55, a top insulation layer 56, and a plurality of (in the embodiment, eleven) interlayer insulation layers 57. The bottom insulation layer 55 is an insulation layer that directly covers the first principal surface 42. The top insulation layer 56 is an insulation layer that constitutes the insulation principal surface 52. The plurality of interlayer insulation layers 57 are insulation layers that are interposed between the bottom and top insulation layers 55 and 56. In the embodiment, the bottom insulation layer 55 has a single-layer structure that contains silicon oxide. In the embodiment, the top insulation layer 56 has a single-layer structure that contains silicon oxide. The bottom and top insulation layers 55 and 56 can each have a thickness of 1 μm or more but 3 μm or less (e.g., about 2 μm).

The plurality of interlayer insulation layers 57 each have a stacked structure that includes a first insulation layer 58 at the bottom insulation layer 55 side and a second insulation layer 59 at the top insulation layer 56 side. The first insulation layer 58 can contain silicon nitride. The first insulation layer 58 is formed as an etching stopper layer for the second insulation layer 59. The first insulation layer 58 can have a thickness of 0.1 μm or more but 1 μm or less (e.g., about 0.3 μm).

The second insulation layer 59 is formed on top of the first insulation layer 58, and contains an insulating material different from that of the first insulation layer 58. The second insulation layer 59 can contain silicon oxide. The second insulation layer 59 can have a thickness of 1 μm or more but 3 μm or less (e.g., about 2 μm). Preferably, the second insulation layer 59 is given a thickness larger than that of the first insulation layer 58.

The insulation layer 51 can have a total thickness DT of 5 μm or more but 50 μm or less. The insulation layer 51 can have any total thickness DT and any number of interlayer insulation layers 57 stacked together, which are adjusted according to the desired dielectric strength voltage (dielectric breakdown withstand voltage). The bottom insulation layer 55, the top insulation layer 56, and the interlayer insulation layers 57 can employ any insulating material, which is thus not limited to any particular insulating material.

The semiconductor device 5 includes a first functional device 45 formed in the insulation layer 51. The first functional device 45 includes one or a plurality of (in the embodiment, a plurality of) transformers 21 (corresponding the transformers mentioned previously). That is, the semiconductor device 5 is a multichannel device that includes a plurality of transformers 21. The plurality of transformers 21 are formed in an inner part of the insulation layer 51, at intervals from the insulation side walls 53A to 53D. The plurality of transformers 21 are formed at intervals from each other in the first direction X.

Specifically, the plurality of transformers 21 include a first transformer 21A, a second transformer 21B, a third transformer 21C, and a fourth transformer 21D that are formed in this order from the insulation side wall 53C side to the insulation side wall 53D side as seen in a plan view. The plurality of transformers 21A to 21D have similar structures. In the following description, the structure of the first transformer 21A will be described as an example. No separate description will be given of the structures of the second, third, and fourth transformers 21B, 21C, and 21D, to which the description of the structure of the first transformer 21A is to be taken to apply.

Referring to FIGS. 5 to 7, the first transformer 21A includes a low-potential coil 22 and a high-potential coil 23. The low-potential coil 22 is formed in the insulation layer 51. The high-potential coil 23 is formed in the insulation layer 51 so as to face the low-potential coil 22 in the normal direction Z. In the embodiment, the low- and high-potential coils 22 and 23 are formed in a region between the bottom and top insulation layers 55 and 56 (i.e., in the plurality of interlayer insulation layer 57).

The low-potential coil 22 is formed in the insulation layer 51, at the bottom insulation layer 55 (semiconductor chip 41) side, and the high-potential coil 23 is formed in the insulation layer 51, at the top insulation layer 56 (insulation principal surface 52) side with respect to the low-potential coil 22. That is, the high-potential coil 23 faces the semiconductor chip 41 across the low-potential coil 22. The low- and high-potential coils 22 and 23 can be disposed at any places. The high-potential coil 23 can face the low-potential coil 22 across one or more interlayer insulation layers 57.

The distance between the low- and high-potential coils 22 and 23 (i.e., the number of interlayer insulation layers 57 stacked together) is adjusted appropriately according to the dielectric strength voltage and electric field strength between the low- and high-potential coils 22 and 23. In the embodiment, the low-potential coil 22 is formed in the third interlayer insulation layer 57 as counted from the bottom insulation layer 55 side. In the embodiment, the high-potential coil 23 is formed in the first interlayer insulation layer 57 as counted from the top insulation layer 56 side.

The low-potential coil 22 is embedded in the interlayer insulation layer 57 so as to penetrate the first and second insulation layers 58 and 59. The low-potential coil 22 includes a first inner end 24, a first outer end 25, and a first spiral portion 26 that is patterned in a spiral shape between the first inner and outer ends 24 and 25. The first spiral portion 26 is patterned in a spiral shape that extends in an elliptical (oval) shape as seen in a plan view. The part of the first spiral portion 26 that forms its inner circumferential edge defines a first inner region 66 that is in an elliptical shape as seen in a plan view.

The first spiral portion 26 can have a number of turns of 5 or more but 30 or less. The first spiral portion 26 can have a width of 0.1 μm or more but 5 μm or less. Preferably, the first spiral portion 26 has a width of 1 μm or more but 3 μm or less. The width of the first spiral portion 26 is defined by its width in the direction orthogonal to the spiraling direction. The first spiral portion 26 has a first winding pitch of 0.1 μm or more but 5 μm or less. Preferably, the first winding pitch is 1 μm or more but 3 μm or less. The first winding pitch is defined by the distance between two parts of the first spiral portion 26 that are adjacent to each other in the direction orthogonal to the spiraling direction.

The first spiral portion 26 can have any winding shape and the first inner region 66 can have any planar shape, which are thus not limited to those shown in FIG. 5 etc. The first spiral portion 26 can be wound in a polygonal shape, such as a triangular or quadrangular shape, or in a circular shape as seen in a plan view. The first inner region 66 can be defined, so as to fit the winding shape of the first spiral portion 26, in a polygonal shape, such as a triangular or quadrangular shape, or in a circular shape as seen in a plan view.

The low-potential coil 22 can contain at least one of titanium, titanium nitride, copper, aluminum, and tungsten. The low-potential coil 22 can have a stacked structure composed of a barrier layer and a body layer. The barrier layer defines a recessed space in the interlayer insulation layer 57. The barrier layer can contain at least one of titanium and titanium nitride. The body layer can contain at least one of copper, aluminum, and tungsten.

The high-potential coil 23 is embedded in the interlayer insulation layer 57 so as to penetrate the first and second insulation layers 58 and 59. The high-potential coil 23 includes a second inner end 27, a second outer end 28, and a second spiral portion 29 that is patterned in a spiral shape between the second inner and outer ends 27 and 28. The second spiral portion 29 is patterned in a spiral shape that extends in an elliptical (oval) shape as seen in a plan view. The part of the second spiral portion 29 that forms its inner circumferential edge defines a second inner region 67 that is in an elliptical shape as seen in a plan view in the embodiment. The second inner region 67 in the second spiral portion 29 faces the first inner region 66 in the first spiral portion 26 in the normal direction Z.

The second spiral portion 29 can have a number of turns of 5 or more but 30 or less. The number of turns of the second spiral portion 29 relative to that of the first spiral portion 26 is adjusted according to the target value of voltage boosting. Preferably, the number of turns of the second spiral portion 29 is larger than that of the first spiral portion 26. Needless to say, the number of turns of the second spiral portion 29 can be smaller than or equal to that of the first spiral portion 26.

The second spiral portion 29 can have a width of 0.1 μm or more but 5 μm or less. Preferably, the second spiral portion 29 has a width of 1 μm or more but 3 μm or less. The width of the second spiral portion 29 is defined by its width in the direction orthogonal to the spiraling direction. Preferably, the width of the second spiral portion 29 is equal to the width of the first spiral portion 26.

The second spiral portion 29 can have a second winding pitch of 0.1 μm or more but m or less. Preferably, the second winding pitch is 1 μm or more but 3 μm or less. The second winding pitch is defined by the distance between two parts of the second spiral portion 29 that are adjacent to each other in the direction orthogonal to the spiraling direction. Preferably, the second winding pitch is equal to the first winding pitch of the first spiral portion 26.

The second spiral portion 29 can have any winding shape and the second inner region 67 can have any planar shape, which are thus not limited to those shown in FIG. 6 etc. The second spiral portion 29 can be wound in a polygonal shape, such as a triangular or quadrangular shape, or in a circular shape as seen in a plan view. The second inner region 67 can be defined, so as to fit the winding shape of the second spiral portion 29, in a polygonal shape, such as a triangular or quadrangular shape, or in a circular shape as seen in a plan view.

Preferably, the high-potential coil 23 is formed of the same conductive material as the low-potential coil 22. That is, preferably, like the low-potential coil 22, the high-potential coil 23 includes a barrier layer and a body layer.

Referring to FIG. 4, the semiconductor device 5 includes a plurality of (in the diagram, twelve) low-potential terminals 11 and a plurality of (in the diagram, twelve) high-potential terminals 12. The plurality of low-potential terminals 11 are electrically connected to the low-potential coils 22 of the corresponding transformers 21A to 21D respectively. The plurality of high-potential terminals 12 are electrically connected to the high-potential coils 23 of the corresponding transformers 21A to 21D respectively.

The plurality of low-potential terminals 11 are formed on the insulation principal surface 52 of the insulation layer 51. Specifically, the plurality of low-potential terminals 11 are formed in a second insulation side wall 53B side region, at an interval from the plurality of transformers 21A to 21D in the second direction Y, and are arrayed at intervals from each other in the first direction X.

The plurality of low-potential terminals 11 include a first low-potential terminal 11A, a second low-potential terminal 11B, a third low-potential terminal 11C, a fourth low-potential terminal 11D, a fifth low-potential terminal 11E, and a sixth low-potential terminal 11F. Actually, in the embodiment, two each of the plurality of low-potential terminals 11A to 11F are formed. The plurality of low-potential terminals 11A to 11F may each include any number of terminals.

The first low-potential terminal 11A faces the first transformer 21A in the second direction Y as seen in a plan view. The second low-potential terminal 11B faces the second transformer 21B in the second direction Y as seen in a plan view. The third low-potential terminal 11C faces the third transformer 21C in the second direction Y as seen in a plan view. The fourth low-potential terminal 11D faces the fourth transformer 21D in the second direction Y as seen in a plan view. The fifth low-potential terminal 11E is formed in a region between the first and second low-potential terminals 11A and 11B as seen in a plan view. The sixth low-potential terminal 11F is formed in a region between the third and fourth low-potential terminals 11C and 11D as seen in a plan view.

The first low-potential terminal 11A is electrically connected to the first inner end 24 of the first transformer 21A (low-potential coil 22). The second low-potential terminal 11B is electrically connected to the first inner end 24 of the second transformer 21B (low-potential coil 22). The third low-potential terminal 11C is electrically connected to the first inner end 24 of the third transformer 21C (low-potential coil 22). The fourth low-potential terminal 11D is electrically connected to the first inner end 24 of the fourth transformer 21D (low-potential coil 22).

The fifth low-potential terminal 11E is electrically connected to the first outer end 25 of the first transformer 21A (low-potential coil 22) and to the first outer end 25 of the second transformer 21B (low-potential coil 22). The sixth low-potential terminal 11F is electrically connected to the first outer end 25 of the third transformer 21C (low-potential coil 22) and to the first outer end 25 of the fourth transformer 21D (low-potential coil 22).

The plurality of high-potential terminals 12 are formed on the insulation principal surface 52 of the insulation layer 51, at an interval from the plurality of low-potential terminals 11. Specifically, the plurality of high-potential terminals 12 are formed in a first insulation side wall 53A side region, at an interval from the plurality of low-potential terminals 11 in the second direction Y, and are arrayed at intervals from each other in the first direction X.

The plurality of high-potential terminals 12 are formed in regions close to the corresponding transformers 21A to 21D, respectively, as seen in a plan view. The high-potential terminals 12 being close to the transformers 21A to 21D means that, as seen in a plan view, the distance between the high-potential terminals 12 and the transformers 21 is smaller than the distance between the low-potential terminals 11 and the high-potential terminals 12.

Specifically, as seen in a plan view, the plurality of high-potential terminals 12 are formed at intervals from each other along the first direction X so as to face the plurality of transformers 21A to 21D along the first direction X. More specifically, as seen in a plan view, the plurality of high-potential terminals 12 are formed at intervals from each other along the first direction X so as to be located in the second inner regions 67 in the high-potential coils 23 and in regions between adjacent high-potential coils 23. As a result, as seen in a plan view, the plurality of high-potential terminals 12 are, along with the transformers 21A to 21D, arrayed in one row along the first direction X.

The plurality of high-potential terminals 12 include a first high-potential terminal 12A, a second high-potential terminal 12B, a third high-potential terminal 12C, a fourth high-potential terminal 12D, a fifth high-potential terminal 12E, and a sixth high-potential terminal 12F. Actually, in the embodiment, two each of the plurality of high-potential terminals 12A to 12F are formed. The plurality of high-potential terminals 12A to 12F may each include any number of terminals.

The first high-potential terminal 12A is formed in the second inner region 67 in the first transformer 21A (high-potential coil 23) as seen in a plan view. The second high-potential terminal 12B is formed in the second inner region 67 in the second transformer 21B (high-potential coil 23) as seen in a plan view. The third high-potential terminal 12C is formed in the second inner region 67 in the third transformer 21C (high-potential coil 23) as seen in a plan view. The fourth high-potential terminal 12D is formed in the second inner region 67 in the fourth transformer 21D (high-potential coil 23) as seen in a plan view. The fifth high-potential terminal 12E is formed in a region between the first and second transformers 21A and 21B as seen in a plan view. The sixth high-potential terminal 12F is formed in a region between the third and fourth transformers 21C and 21D as seen in a plan view.

The first high-potential terminal 12A is electrically connected to the second inner end 27 of the first transformer 21A (high-potential coil 23). The second high-potential terminal 12B is electrically connected to the second inner end 27 of the second transformer 21B (high-potential coil 23). The third high-potential terminal 12C is electrically connected to the second inner end 27 of the third transformer 21C (high-potential coil 23). The fourth high-potential terminal 12D is electrically connected to the second inner end 27 of the fourth transformer 21D (high-potential coil 23).

The fifth high-potential terminal 12E is electrically connected to the second outer end 28 of the first transformer 21A (high-potential coil 23) and to the second outer end 28 of the second transformer 21B (high-potential coil 23). The sixth high-potential terminal 12F is electrically connected to the second outer end 28 of the third transformer 21C (high-potential coil 23) and to the second outer end 28 of the fourth transformer 21D (high-potential coil 23).

Referring to FIGS. 5 and 7, the semiconductor device 5 includes a first low-potential wiring 31, a second low-potential wiring 32, a first high-potential wiring 33, and a second high-potential wiring 34, all formed in the insulation layer 51. Actually, in the embodiment, a plurality of first low-potential wirings 31, a plurality of second low-potential wirings 32, a plurality of first high-potential wirings 33, and a plurality of second high-potential wirings 34 are formed.

The first and second low-potential wirings 31 and 32 hold the low-potential coils 22 of the first and second transformers 21A and 21B at equal potentials. The first and second low-potential wirings 31 and 32 also hold the low-potential coils 22 of the third and fourth transformers 21C and 21D at equal potentials. In the embodiment, the first and second low-potential wirings 31 and 32 hold the low-potential coils 22 of all the transformers 21A to 21D at equal potentials.

The first and second high-potential wirings 33 and 34 hold the high-potential coils 23 of the first and second transformers 21A and 21B at equal potentials. The first and second high-potential wirings 33 and 34 also hold the high-potential coils 23 of the third and fourth transformers 21C and 21D at equal potentials. In the embodiment, the first and second high-potential wirings 33 and 34 hold the high-potential coils 23 of all the transformers 21A to 21D at equal potentials.

The plurality of first low-potential wirings 31 are electrically connected respectively to the corresponding low-potential terminals 11A to 11D and to the first inner ends 24 of the corresponding transformers 21A to 21D (low-potential coils 22). The plurality of first low-potential wirings 31 have similar structures. In the following description, the structure of the first low-potential wiring 31 connected to the first low-potential terminal 11A and to the first transformer 21A will be described as an example. No separate description will be given of the structures of the other first low-potential wirings 31, to which the description of the structure of the first low-potential wiring 31 connected to the first transformer 21A is to be taken to apply.

The first low-potential wiring 31 includes a through wiring 71, a low-potential connection wiring 72, a lead wiring 73, a first connection plug electrode 74, a second connection plug electrode 75, one or a plurality of (in this embodiment, a plurality of) pad plug electrodes 76, and one or a plurality of (in this embodiment, a plurality of) substrate plug electrodes 77.

Preferably, the through wiring 71, the low-potential connection wiring 72, the lead wiring 73, the first connection plug electrode 74, the second connection plug electrode 75, the pad plug electrodes 76, and the substrate plug electrodes 77 are formed of the same conductive material as the low-potential coil 22 and the like. That is, preferably, like the low-potential coil 22 and the like, the through wiring 71, the low-potential connection wiring 72, the lead wiring 73, the first connection plug electrode 74, the second connection plug electrode 75, the pad plug electrodes 76, and the substrate plug electrodes 77 each include a barrier layer and a body layer.

The through wiring 71 penetrates a plurality of interlayer insulation layers 57 in the insulation layer 51 and extends in a columnar shape along the normal direction Z. In the embodiment, the through wiring 71 is formed in a region between the bottom and top insulation layers 55 and 56 in the insulation layer 51. The through wiring 71 has a top end part at the top insulation layer 56 side and a bottom end part at the bottom insulation layer 55 side. The top end part of the through wiring 71 is formed in the same interlayer insulation layer 57 as the high-potential coil 23, and is covered by the top insulation layer 56. The bottom end part of the through wiring 71 is formed in the same interlayer insulation layer 57 as the low-potential coil 22.

In the embodiment, the through wiring 71 includes a first electrode layer 78, a second electrode layer 79, and a plurality of wiring plug electrodes 80. In the through wiring 71, the first and second electrode layers 78 and 79 and the wiring plug electrodes 80 are formed of the same conductive material as the low-potential coil 22 and the like. That is, like the low-potential coil 22 and the like, the first and second electrode layers 78 and 79 and the wiring plug electrodes 80 each include a barrier layer and a body layer.

The first electrode layer 78 constitutes the top end part of the through wiring 71. The second electrode layer 79 constitutes the bottom end part of the through wiring 71. The first electrode layer 78 is formed as an island, and faces the low-potential terminal 11 (first low-potential terminal 11A) in the normal direction Z. The second electrode layer 79 is formed as an island, and faces the first electrode layer 78 in the normal direction Z.

The plurality of wiring plug electrodes 80 are embedded respectively in the plurality of interlayer insulation layers 57 located in a region between the first and second electrode layers 78 and 79. The plurality of wiring plug electrodes 80 are stacked together from the bottom insulation layer 55 to the top insulation layer 56 so as to be electrically connected together, and electrically connect together the first and second electrode layers 78 and 79. The plurality of wiring plug electrodes 80 each have a plane area smaller than the plane area of either of the first and second electrode layers 78 and 79.

The number of layers stacked in the plurality of wiring plug electrodes 80 is equal to the number of layers stacked in the plurality of interlayer insulation layer 57. In the embodiment, six wiring plug electrodes 80 are embedded in interlayer insulation layers 57 respectively, and any number of wiring plug electrodes 80 can be embedded in interlayer insulation layers 57 respectively. Needless to say, one or a plurality of wiring plug electrodes 80 can be formed that penetrates a plurality of interlayer insulation layers 57.

The low-potential connection wiring 72 is formed in the same interlayer insulation layer 57 as the low-potential coil 22, in the first inner region 66 in the first transformer 21A (low-potential coil 22). The low-potential connection wiring 72 is formed as an island, and faces the high-potential terminal 12 (first high-potential terminal 12A) in the normal direction Z. Preferably, the low-potential connection wiring 72 has a plane area larger than the plane area of the wiring plug electrode 80. The low-potential connection wiring 72 is electrically connected to the first inner end 24 of the low-potential coil 22.

The lead wiring 73 is formed in the interlayer insulation layer 57, in a region between the semiconductor chip 41 and the through wiring 71. In the embodiment, the lead wiring 73 is formed in the first interlayer insulation layer 57 as counted from the bottom insulation layer 55. The lead wiring 73 has a first end part at one side, a second end part at the other side, and a wiring part that connects together the first and second end parts. The first end part of the lead wiring 73 is located in a region between the semiconductor chip 41 and the bottom end part of the through wiring 71. The second end part of the lead wiring 73 is located in a region between the semiconductor chip 41 and the low-potential connection wiring 72. The wiring part extends along the first principal surface 42 of the semiconductor chip 41, and extends in the shape of a stripe in a region between the first and second end parts.

The first connection plug electrode 74 is formed in the interlayer insulation layer 57, in a region between the through wiring 71 and the lead wiring 73, and is electrically connected to the through wiring 71 and to the first end part of the lead wiring 73. The second connection plug electrode 75 is formed in the interlayer insulation layer 57, in a region between the low-potential connection wiring 72 and the lead wiring 73, and is electrically connected to the low-potential connection wiring 72 and to the second end part of the lead wiring 73.

The plurality of pad plug electrodes 76 are formed in the top insulation layer 56, in a region between the low-potential terminal 11 (first low-potential terminal 11A) and the through wiring 71, and are electrically connected to the low-potential terminal 11 and to the top end part of the through wiring 71. The plurality of substrate plug electrodes 77 are formed in the bottom insulation layer 55, in a region between the semiconductor chip 41 and the lead wiring 73. In the embodiment, the substrate plug electrodes 77 are formed in a region between the semiconductor chip 41 and the first end part of the lead wiring 73, and are electrically connected to the semiconductor chip 41 and to the first end part of the lead wiring 73.

Referring to FIGS. 6 and 7, the plurality of first high-potential wirings 33 are connected respectively to the corresponding high-potential terminals 12A to 12D and to the second inner ends 27 of the corresponding transformers 21A to 21D (high-potential coils 23). The plurality of first high-potential wirings 33 have similar structures. In the following description, the structure of the first high-potential wiring 33 connected to the first high-potential terminal 12A and to the first transformer 21A will be described as an example. No description will be given of the structures of the other first high-potential wirings 33, to which the description of the structure of the first high-potential wiring 33 connected to the first transformer 21A is to be taken to apply.

The first high-potential wiring 33 includes a high-potential connection wiring 81 and one or a plurality of (in this embodiment, a plurality of) pad plug electrodes 82. Preferably, the high-potential connection wiring 81 and the pad plug electrodes 82 are formed of the same conductive material as the low-potential coil 22 and the like. That is, preferably, like the low-potential coil 22 and the like, the high-potential connection wiring 81 and the pad plug electrodes 82 each include a barrier layer and a body layer.

The high-potential connection wiring 81 is formed in the same interlayer insulation layer 57 as the high-potential coil 23, in the second inner region 67 in the high-potential coil 23. The high-potential connection wiring 81 is formed as an island, and faces the high-potential terminal 12 (first high-potential terminal 12A) in the normal direction Z. The high-potential connection wiring 81 is electrically connected to the second inner end 27 of the high-potential coil 23. The high-potential connection wiring 81 is formed at an interval from the low-potential connection wiring 72 as seen in a plan view, and does not face the low-potential connection wiring 72 in the normal direction Z. This results in an increased insulation distance between the low- and high-potential connection wirings 72 and 81 and hence an increased dielectric strength voltage in the insulation layer 51.

The plurality of pad plug electrodes 82 are formed in the top insulation layer 56, in a region between the high-potential terminal 12 (first high-potential terminal 12A) and the high-potential connection wiring 81, and are electrically connected to the high-potential terminal 12 and to the high-potential connection wiring 81. The plurality of pad plug electrodes 82 each have a plane area smaller than the plane area of the high-potential connection wiring 81 as seen in a plan view.

Referring to FIG. 7, preferably, the distance D1 between the low- and high-potential terminals 11 and 12 is larger than the distance D2 between the low- and high-potential coils 22 and 23 (D2<D1). Preferably, the distance D1 is larger than the total thickness DT of the plurality of interlayer insulation layers 57 (DT<D1). The ratio D2/D1 of the distance D2 to the distance D1 can be 0.01 or more but 0.1 or less. Preferably, the distance D1 is 100 μm or more but 500 μm or less. The distance D2 can be 1 μm or more but 50 μm or less. Preferably, the distance D2 is 5 μm or more but 25 μm or less. The distances D1 and D2 can have any values, which are adjusted appropriately according to the desired dielectric strength voltage.

Referring to FIGS. 6 and 7, the semiconductor device 5 has a dummy pattern 85 that is embedded in the insulation layer 51 so as to be located around the transformers 21A to 21D as seen in a plan view.

The dummy pattern 85 is formed in a pattern different (discontinuous) from that of either of the high- and low-potential coils 23 and 22, and is independent of the transformers 21A to 21D. That is, the dummy pattern 85 does not function as part of the transformers 21A to 21D. The dummy pattern 85 is formed as a shield conductor layer that shields electric fields between the low- and high-potential coils 22 and 23 in the transformers 21A to 21D to suppress electric field concentration on the high-potential coil 23. In the embodiment, the dummy pattern 85 is patterned at a line density per unit area that is equal to the line density of the high-potential coil 23. The line density of the dummy pattern 85 being equal to the line density of the high-potential coil 23 means that the line density of the dummy pattern 85 falls within the range of ±20% of the line density of the high-potential coil 23.

The dummy pattern 85 can be formed at any depth in the insulation layer 51, which is adjusted according to the electric field strength to be attenuated. Preferably, the dummy pattern 85 is formed in a region closer to the high-potential coil 23 than to the low-potential coil 22 with respect to the normal direction Z. The dummy pattern 85 being closer to the high-potential coil 23 with respect to the normal direction Z means that, with respect to the normal direction Z, the distance between the dummy pattern 85 and the high-potential coil 23 is smaller than the distance between the dummy pattern 85 and the low-potential coil 22.

In that way, electric field concentration on the high-potential coil 23 can be suppressed properly. The smaller the distance between the dummy pattern 85 and the high-potential coil 23 with respect to the normal direction Z, the more effectively electric field concentration on the high-potential coil 23 can be suppressed. Preferably, the dummy pattern 85 is formed in the same interlayer insulation layer 57 as the high-potential coil 23. In that way, electric field concentration on the high-potential coil 23 can be suppressed more properly. The dummy pattern 85 includes a plurality of dummy patterns that are in varying electrical states. The dummy pattern 85 can include a high-potential dummy pattern.

The high-potential dummy pattern 86 can be formed at any depth in the insulation layer 51, which is adjusted according to the electric field strength to be attenuated. Preferably, the high-potential dummy pattern 86 is formed in a region closer to the high-potential coil 23 than to the low-potential coil 22 with respect to the normal direction Z. The high-potential dummy pattern 86 being closer to the high-potential coil 23 with respect to the normal direction Z means that, with respect to the normal direction Z, the distance between the high-potential dummy pattern 86 and the high-potential coil 23 is smaller than the distance between the high-potential dummy pattern 86 and the low-potential coil 22.

The dummy pattern 85 includes a floating dummy pattern that is formed in an electrically floating state in the insulation layer 51 so as to be located around the transformers 21A to 21D.

In the embodiment, the floating dummy pattern is patterned in dense lines so as to partly cover and partly expose a region around the high-potential coil 23 as seen in a plan view. The floating dummy pattern can be formed so as to have ends or no ends.

The floating dummy pattern can be formed at any depth in the insulation layer 51, which is adjusted according to the electric field strength to be attenuated.

Any number of floating lines can be provided, which is adjusted according to the electric field strength to be attenuated. The floating dummy pattern can include a plurality of floating dummy patterns.

Referring to FIG. 7, the semiconductor device 5 includes a second functional device 60 that is formed in the first principal surface 42 of the semiconductor chip 41 in a device region 62. The second functional device 60 is formed using a superficial part of the first principal surface 42 and/or a region on the first principal surface 42 of the semiconductor chip 41, and is covered by the insulation layer 51 (bottom insulation layer 55). In FIG. 7, the second functional device 60 is shown in a simplified form by broken lines indicated in a superficial part of the first principal surface 42.

The second functional device 60 is electrically connected to a low-potential terminal 11 via a low-potential wiring, and is electrically connected to a high-potential terminal 12 via a high-potential wiring. Except that the low-potential wiring is patterned in the insulation layer 51 so as to be connected to the second functional device 60, it has a similar structure to the first low-potential wiring 31 (second low-potential wiring 32). Except that the high-potential wiring is patterned in the insulation layer 51 so as to be connected to the second functional device 60, it has a similar structure to the first high-potential wiring 33 (second high-potential wiring 34). No description will be given of the low- and high-potential wirings associated with the second functional device 60.

The second functional device 60 can include at least one of a passive device, a semiconductor rectification device, and a semiconductor switching device. The second functional device 60 can include a circuit network comprising a selective combination of any two or more of a passive device, a semiconductor rectification device, and a semiconductor switching device. The circuit network can constitute part or the whole of an integrated circuit.

The passive device can include a semiconductor passive device. The passive device can include one or both of a resistor and a capacitor. The semiconductor rectification device can include at least one of a pn-junction diode, a PIN diode, a Zener diode, a Schottky barrier diode, and a fast-recovery diode. The semiconductor switching device can include at least one of a BJT (bipolar junction transistor), a MISFET (metal-insulator-semiconductor field-effect transistor), an IGBT (insulated-gate bipolar junction transistor), and a JFET (junction field-effect transistor).

Referring to FIGS. 5 to 7, the semiconductor device 5 further includes a sealing conductor 61 embedded in the insulation layer 51. The sealing conductor 61 is embedded in the form of walls in the insulation layer 51, at intervals from the insulation side walls 53A to 53D as seen in a plan view, and partitions the insulation layer 51 into the device region 62 and an outer region 63. The sealing conductor 61 prevents moisture entry and crack development from the outer region 63 to the device region 62.

The device region 62 is a region that includes the first functional device 45 (plurality of transformers 21), the second functional device 60, the plurality of low-potential terminals 11, the plurality of high-potential terminals 12, the first low-potential wirings 31, the second low-potential wirings 32, the first high-potential wirings 33, the second high-potential wirings 34, and the dummy pattern 85. The outer region 63 is a region outside the device region 62.

The sealing conductor 61 is electrically isolated from the device region 62. Specifically, the sealing conductor 61 is electrically isolated from the first functional device 45 (plurality of transformers 21), the second functional device 60, the plurality of low-potential terminals 11, the plurality of high-potential terminals 12, the first low-potential wirings 31, the second low-potential wirings 32, the first high-potential wirings 33, the second high-potential wirings 34, and the dummy pattern 85. More specifically, the sealing conductor 61 is held in an electrically floating state. The sealing conductor 61 does not form a current path connected to the device region 62.

The sealing conductor 61 is formed in the shape of a stripe along the insulation side walls 53A to 53D. In the embodiment, the sealing conductor 61 is formed in a quadrangular ring shape (specifically, a rectangular ring shape) as seen in a plan view. Thus, the sealing conductor 61 defines the outer region 63 in a quadrangular ring shape (specifically, a rectangular ring shape) surrounding the device region 62 as seen in a plan view.

Specifically, the sealing conductor 61 has a top end part at the insulation principal surface 52 side, a bottom end part at the semiconductor chip 41 side, and a wall part that extends in the form of walls between the top and bottom end parts. In the embodiment, the top end part of the sealing conductor 61 is formed at an interval from the insulation principal surface 52 toward the semiconductor chip 41, and is located in the insulation layer 51. In the embodiment, the top end part of the sealing conductor 61 is covered by the top insulation layer 56. The top end part of the sealing conductor 61 can be covered by one or a plurality of interlayer insulation layers 57. The top end part of the sealing conductor 61 can be exposed through the top insulation layer 56. The bottom end part of the sealing conductor 61 is formed at an interval from the semiconductor chip 41 toward the top end part.

Thus, in the embodiment, the sealing conductor 61 is embedded in the insulation layer 51 so as to be located at the semiconductor chip 41 side of the plurality of low-potential terminals 11 and the plurality of high-potential terminals 12. Moreover, in the insulation layer 51, the sealing conductor 61 faces, in the direction parallel to the insulation principal surface 52, the first functional device 45 (plurality of transformers 21), the first low-potential wirings 31, the second low-potential wirings 32, the first high-potential wirings 33, the second high-potential wirings 34, and the dummy pattern 85. In the insulation layer 51, the sealing conductor 61 can face, in the direction parallel to the insulation principal surface 52, part of the second functional device 60.

The sealing conductor 61 includes a plurality of sealing plug conductors 64 and one or a plurality of (in the embodiment, a plurality of) sealing via conductors 65. Any number of sealing via conductors 65 may be provided. Of the plurality of sealing plug conductors 64, the top sealing plug conductor 64 constitutes the top end part of the sealing conductor 61. The plurality of sealing via conductors 65 constitute the bottom end part of the sealing conductor 61. Preferably, the sealing plug conductors 64 and the sealing via conductors 65 are formed of the same conductive material as the low-potential coil 22. That is, preferably, like the low-potential coil 22 and the like, the sealing plug conductors 64 and the sealing via conductors 65 each include a barrier layer and a body layer.

The plurality of sealing plug conductors 64 are embedded in the plurality of interlayer insulation layers 57 respectively, and are each formed in a quadrangular ring shape (specifically, a rectangular ring shape) surrounding the device region 62. The plurality of sealing plug conductors 64 are stacked together from the bottom insulation layer 55 to the top insulation layer 56 so as to be connected together. The number of layers stacked in the plurality of sealing plug conductors 64 is equal to the number of layers in the plurality of interlayer insulation layers 57. Needless to say, one or a plurality of sealing plug conductors 64 may be formed that penetrates a plurality of interlayer insulation layers 57.

So long as a set of a plurality of sealing plug conductor 64 constitutes one ring-shaped sealing conductor 61, not all the sealing plug conductors 64 need be formed in a ring shape. For example, at least one of the plurality of sealing plug conductors 64 can be formed so as to have ends. Or at least one of the plurality of sealing plug conductors 64 may be divided into a plurality of strip-shaped portions with ends. However, with consideration given to the risk of moisture entry and crack development into the device region 62, preferably, the plurality of sealing plug conductors 64 are formed so as to have no ends (in a ring shape).

The plurality of sealing via conductors 65 are formed in the bottom insulation layer 55, in a region between the semiconductor chip 41 and the sealing plug conductors 64. The plurality of sealing via conductors 65 are formed at an interval from the semiconductor chip 41, and are connected to the sealing plug conductors 64. The plurality of sealing via conductors 65 have a plane area smaller than the plane area of the sealing plug conductors 64. In a case where a single sealing via conductor 65 is formed, the single sealing via conductors 65 can have a plane area larger than the plane area of the sealing plug conductors 64.

The sealing conductor 61 can have a width of 0.1 μm or more but 10 μm or less. Preferably, the sealing conductor 61 has a width of 1 μm or more but 5 μm or less. The width of the sealing conductor 61 is defined by its width in the direction orthogonal to the direction in which it extends.

Referring to FIGS. 7 and 8, the semiconductor device 5 further includes a separation structure 130 that is interposed between the semiconductor chip 41 and the sealing conductor 61 and that electrically isolates the sealing conductor 61 from the semiconductor chip 41. Preferably, the separation structure 130 includes an insulator. In the embodiment, the separation structure 130 is a field insulation film 131 formed on the first principal surface 42 of the semiconductor chip 41.

The field insulation film 131 includes at least one of an oxide film (silicon oxide film) and a nitride film (silicon nitride film). Preferably, the field insulation film 131 is a LOCOS (local oxidation of silicon) film as one example of an oxide film that is formed through oxidation of the first principal surface 42 of the semiconductor chip 41. The field insulation film 131 can have any thickness so long as it can insulate between the semiconductor chip 41 and the sealing conductor 61. The field insulation film 131 can have a thickness of 0.1 μm or more but 5 μm or less.

The separation structure 130 is formed on the first principal surface 42 of the semiconductor chip 41, and extends in the shape of a stripe along the sealing conductor 61 as seen in a plan view. In the embodiment, the separation structure 130 is formed in a quadrangular ring shape (specifically, a rectangular ring shape) as seen in a plan view. The separation structure 130 has a connection portion 132 to which the bottom end part of the sealing conductor 61 (i.e., the sealing via conductors 65) is connected. The connection portion 132 can form an anchor portion into which the bottom end part of the sealing conductor 61 (i.e., the sealing via conductors 65) is anchored toward the semiconductor chip 41. Needless to say, the connection portion 132 can be formed to be flush with the principal surface of the separation structure 130.

The separation structure 130 includes an inner end part 130A at the device region 62 side, an outer end part 130B at the outer region 63 side, and a main body part 130C between the inner and outer end parts 130A and 130B. As seen in a plan view, the inner end part 130A defines the region where the second functional device 60 is formed (i.e., the device region 62). The inner end part 130A can be formed integrally with an insulation film (not illustrated) formed on the first principal surface 42 of the semiconductor chip 41.

The outer end part 130B is exposed on the chip side walls 44A to 44D of the semiconductor chip 41, and is continuous with the chip side walls 44A to 44D of the semiconductor chip 41. More specifically, the outer end part 130B is formed so as to be flush with the chip side walls 44A to 44D of the semiconductor chip 41. The outer end part 130B constitutes a polished surface between, to be flush with, the chip side walls 44A to 44D of the semiconductor chip 41 and the insulation side walls 53A to 53D of the insulation layer 51. Needless to say, an embodiment is also possible where the outer end part 130B is formed within the first principal surface 42 at intervals from the chip side walls 44A to 44D.

The main body part 130C has a flat surface that extends substantially parallel to the first principal surface 42 of the semiconductor chip 41. The main body part 130C has the connection portion 132 to which the bottom end part of the sealing conductor 61 (i.e., the sealing via conductors 65) is connected. The connection portion 132 is formed in the main body part 130C, at intervals from the inner and outer end parts 130A and 130B. The separation structure 130 can be implemented in many ways other than in the form of a field insulation film 131.

Referring to FIG. 7, the semiconductor device 5 further includes an inorganic insulation layer 140 formed on the insulation principal surface 52 of the insulation layer 51 so as to cover the sealing conductor 61. The inorganic insulation layer 140 can be called a passivation layer. The inorganic insulation layer 140 protects the insulation layer 51 and the semiconductor chip 41 from above the insulation principal surface 52.

In the embodiment, the inorganic insulation layer 140 has a stacked structure composed of a first inorganic insulation layer 141 and a second inorganic insulation layer 142. The first inorganic insulation layer 141 can contain silicon oxide. Preferably, the first inorganic insulation layer 141 contains USG (undoped silicate glass), which is undoped silicon oxide. The first inorganic insulation layer 141 can have a thickness of 50 nm or more but 5000 nm or less. The second inorganic insulation layer 142 can contain silicon nitride. The second inorganic insulation layer 142 can have a thickness of 500 nm or more but 5000 nm or less. Increasing the total thickness of the inorganic insulation layer 140 helps increase the dielectric strength voltage above the high-potential coils 23.

In a configuration where the first inorganic insulation layer 141 is made of USG and the second inorganic insulation layer 142 is made of silicon nitride, USG has the higher dielectric breakdown voltage (V/cm) than silicon nitride. In view of this, when thickening the inorganic insulation layer 140, it is preferable to form the first inorganic insulation layer 141 thicker than the second inorganic insulation layer 142.

The first inorganic insulation layer 141 can contain at least one of BPSG (boron-doped phosphor silicate glass) and PSG (phosphorus silicate glass) as examples of silicon oxide. In that case, however, since the silicon oxide contains a dopant (boron or phosphorus), for an increased dielectric strength voltage above the high-potential coils 23, it is particularly preferable to form the first inorganic insulation layer 141 of USG. Needless to say, the inorganic insulation layer 140 can have a single-layer structure composed of either the first or second inorganic insulation layer 141 or 142.

The inorganic insulation layer 140 covers the entire area of the sealing conductor 61, and has a plurality of low-potential pad openings 143 and a plurality of high-potential pad openings 144 that are formed in a region outside the sealing conductor 61. The plurality of low-potential pad openings 143 expose the plurality of low-potential terminals 11 respectively. The plurality of high-potential pad openings 144 expose the plurality of high-potential terminals 12 respectively. The inorganic insulation layer 140 can have overlap parts that overlap circumferential edge parts of the low-potential terminals 11. The inorganic insulation layer 140 can have overlap parts that overlap circumferential edge parts of the high-potential terminals 12.

The semiconductor device 5 further includes an organic insulation layer 145 that is formed on the inorganic insulation layer 140. The organic insulation layer 145 can contain photosensitive resin. The organic insulation layer 145 can contain at least one of polyimide, polyamide, and polybenzoxazole. In the embodiment, the organic insulation layer 145 contains polyimide. The organic insulation layer 145 can have a thickness of 1 μm or more but 50 μm or less.

Preferably, the organic insulation layer 145 has a thickness larger than the total thickness of the inorganic insulation layer 140. Moreover, preferably, the inorganic and organic insulation layers 140 and 145 together have a total thickness larger than the distance D2 between the low- and high-potential coils 22 and 23. In that case, preferably, the inorganic insulation layer 140 has a total thickness of 2 μm or more but 10 μm or less. Preferably, the organic insulation layer 145 has a thickness of 5 μm or more but 50 μm or less. Such structures help suppress an increase in the thicknesses of the inorganic and organic insulation layers 140 and 145 while appropriately increasing the dielectric strength voltage above the high-potential coil 23 owing to the stacked film of the inorganic and organic insulation layers 140 and 145.

The organic insulation layer 145 includes a first part 146 that covers a low-potential side region and a second part 147 that covers a high-potential side region. The first part 146 covers the sealing conductor 61 across the inorganic insulation layer 140. The first part 146 has a plurality of low-potential terminal openings 148 through which the plurality of low-potential terminals 11 (low-potential pad openings 143) are respectively exposed in a region outside the sealing conductor 61. The first part 146 can have overlapping parts that overlap circumferential edges (overlap parts) of the low-potential pad openings 143.

The second part 147 is formed at an interval from the first part 146, and exposes the inorganic insulation layer 140 between the first and second parts 146 and 147. The second part 147 has a plurality of high-potential terminal openings 149 through which the plurality of high-potential terminals 12 (high-potential pad openings 144) are respectively exposed. The second part 147 can have overlap parts that overlap circumferential edges (overlap parts) of the high-potential pad openings 144.

The second part 147 covers the transformers 21A to 21D and the dummy pattern 85 together. Specifically, the second part 147 covers the plurality of high-potential coils 23, the plurality of high-potential terminals 12, a first high-potential dummy pattern 87, a second high-potential dummy pattern 88, and a floating dummy pattern 121 together.

The present disclosure can be implemented in any other embodiments. The embodiment described above deals with an example where a first functional device 45 and a second functional device 60 are formed. An embodiment is however also possible that only has a second functional device 60, with no first functional device 45. In that case, the dummy pattern 85 may be omitted. This structure provides, with respect to the second functional device 60, effects similar to those mentioned in connection with the first embodiment (except those associated with the dummy pattern 85).

That is, in a case where a voltage is applied to the second functional device 60 via the low- and high-potential terminals 11 and 12, it is possible suppress unnecessary conduction between the high-potential terminal 12 and the sealing conductor 61. Likewise, in a case where a voltage is applied to the second functional device 60 via the low- and high-potential terminals 11 and 12, it is possible suppress unnecessary conduction between the low-potential terminal 11 and the sealing conductor 61.

The embodiment described above deals with an example where a second functional device 60 is formed. The second functional device 60 however is not essential, and can be omitted.

The embodiment described above deals with an example where a dummy pattern 85 is formed. The dummy pattern 85 however is not essential, and can be omitted.

The embodiment described above deals with an example where the first functional device 45 is of a multichannel type that includes a plurality of transformers 21. It is however also possible to employ a single-channel first functional device 45 that includes a single transformer 21.

<Transformer Layout>

Figure 9:
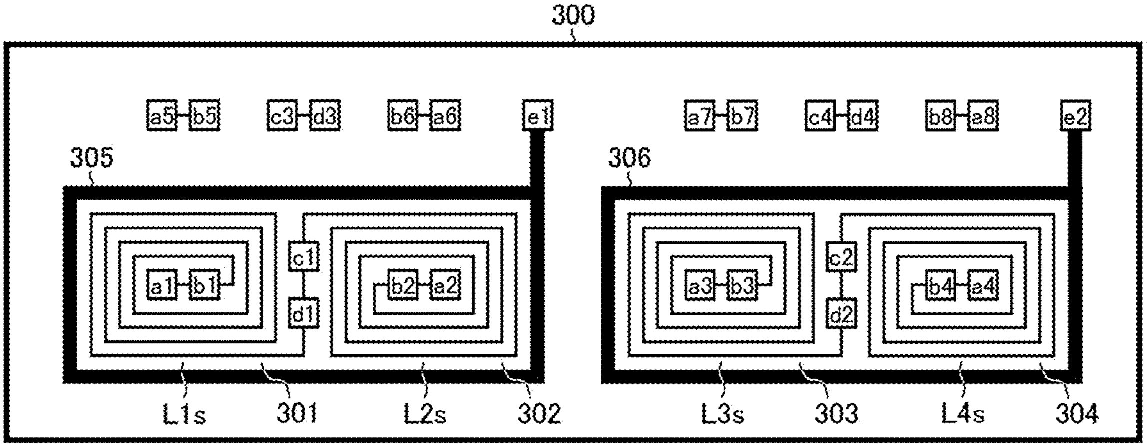
FIG. 9 is a diagram schematically showing an example of the layout of a transformer chip.

FIG. 9 is a plan view (top view) schematically showing one example of transformer layout in a two-channel transformer chip 300 (corresponding to the semiconductor device 5 described previously). The transformer chip 300 shown there includes a first transformer 301, a second transformer 302, a third transformer 303, a fourth transformer 304, a first guard ring 305, a second guard ring 306, pads a1 to a8, pads b1 to b8, pads c1 to c4, and pads d1 to d4.

In the transformer chip 300, the pads a1 and b1 are connected to one terminal of the secondary coil L1*s* of the first transformer 301, and the pads c1 and d1 are connected to the other terminal of that secondary coil L1*s*. The pads a2 and b2 are connected to one terminal of the secondary coil L2*s* of the second transformer 302, and the pads c1 and d1 are connected to the other terminal of that secondary coil L2*s*.

Moreover, the pads a3 and b3 are connected to one terminal of the secondary coil L3*s* of the third transformer 303, and the pads c2 and d2 are connected to the other terminal of that secondary coil L3*s*. The pads a4 and b4 are connected to one terminal of the secondary coil L4*s* of the fourth transformer 304, and the pads c2 and d2 are connected to the other terminal of that secondary coil L4*s*.

FIG. 9 does not show any of the primary coils of the first, second, third, and fourth transformers 301, 302, 303, and 304. The primary coils basically have structures similar to those of the secondary coils L1*s* to L4*s* respectively, and are disposed right below the secondary coils L1*s* to L4*s*, respectively, so as to face them.

Specifically, the pads a5 and b5 are connected to one terminal of the primary coil of the first transformer 301, and the pads c3 and d3 are connected to the other terminal of that primary coil. Likewise, the pads a6 and b6 are connected to one terminal of the primary coil of the second transformer 302, and the pads c3 and d3 are connected to the other terminal of that primary coil.

Likewise, the pads a7 and b7 are connected to one terminal of the primary coil of the third transformer 303, and the pads c4 and d4 are connected to the other terminal of that primary coil. Likewise, the pads a8 and b8 are connected to one terminal of the primary coil of the fourth transformer 304, and the pads c4 and d4 are connected to the other terminal of that primary coil.

The pads a5 to a8, the pads b5 to b8, the pads c3 and c4, and the pads d3 and d4 mentioned above are each led from inside the transformer chip 300 to its surface across an unillustrated via.

Of the plurality of pads mentioned above, the pads a1 to a8 each correspond to a first current feed pad, and the pads b1 to b8 each correspond to a first voltage measurement pad; the pads c1 to c4 each correspond to a second current feed pad, and the pads d1 to d4 each correspond to a second voltage measurement pad.

Thus, the transformer chip 300 of this configuration example permits, during its defect inspection, accurate measurement of the series resistance component across each coil. It is thus possible not only to reject defective products with a broken wire in a coil but also to appropriately reject defective products with an abnormal resistance value in a coil (e.g., a midway short circuit between coils), and hence to prevent defective products from being distributed in the market.

For a transformer chip 300 that has passed the defect inspection mentioned above, the plurality of pads described above can be used for connection with a primary-side chip and a secondary-side chip (e.g., the controller chip 210 and the driver chip 220 described previously).

Specifically, the pads a1 and b1, the pads a2 and b2, the pads a3 and b3, and the pads a4 and b4 can each be connected to one of the signal input and output terminals of the secondary-side chip; the pads c1 and d1 and the pads c2 and d2 can each be connected to a common voltage application terminal (GND2) of the secondary-side chip.

On the other hand, the pads a5 and b5, the pads a6 and b6, the pads a7 and b7, and the pads a8 and b8 can each be connected to one of the signal input and output terminals of the primary-side chip; the pads c3 and d3 and the pads c4 and d4 can each be connected to a common voltage application terminal (GND1) of the primary-side chip.

Here, as shown in FIG. 9, the first to fourth transformers 301 to 304 are so arranged as to be coupled for each signal transmission direction. In terms of what is shown in the diagram, for example, the first and second transformers 301 and 302, which transmit a signal from the primary-side chip to the secondary-side chip, are coupled into a first pair by the first guard ring 305. Likewise, for example, the third and fourth transformers 303 and 302, which transmit a signal from the secondary-side chip to the primary-side chip, are coupled into a second pair by the second guard ring 306.

Such coupling is intended, in a structure where the primary and secondary coils of each of the first to fourth transformers 301 to 304 are formed so as to be stacked on each other in the up-down direction of the substrate, to obtain a desired withstand voltage between the primary and secondary coils. The first and second guard rings 305 and 306 are however not essential elements.

The first and second guard rings 305 and 306 can be connected via pads e1 and e2, respectively, to a low-impedance wiring such as a grounded terminal.

In the transformer chip 300, the pads c1 and d1 are shared between the secondary coils L1*s* and L2*s*. The pads c2 and d2 are shared between the secondary coils L3*s* and L4*s*. The pads c3 and d3 are shared between the primary coils Lip and L2*p*. The pads c4 and d4 are shared between the primary coils that correspond to them respectively. This configuration helps reduce the number of pads and helps make the transformer chip 300 compact.

Moreover, as shown in FIG. 9, the primary and secondary coils of the first to fourth transformers 301 to 304 are preferably each wound in a rectangular shape (or, with the corners rounded, in a running-track shape) as seen in a plan view of the transformer chip 300. This configuration helps increase the area over which the primary and secondary coils overlap each other and helps enhance the transmission efficiency across the transformers.

Needless to say, the illustrated transformer layout is merely an example; any number of coils of any shape can be disposed in any layout, and pads can be disposed in any layout. Any of the chip structure, transformer layouts, etc. described above can be applied to semiconductor devices in general that have a coil integrated in a semiconductor chip.

Pulse Drive Circuit (Comparative Example)

Figure 10:
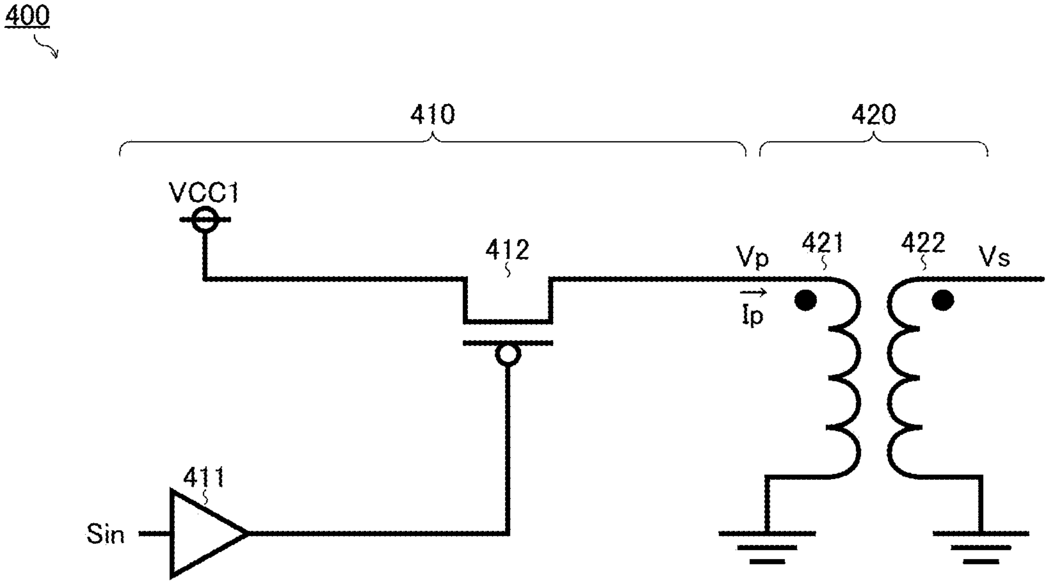
FIG. 10 is a diagram showing a pulse drive circuit according to a comparative example.

FIG. 10 is a diagram showing a pulse drive circuit according to a comparative example (a common configuration to be compared with the practical examples described later). The pulse drive circuit 400 in the diagram includes a pulse drive circuit 410 and a transformer 420. The pulse drive circuit 400 corresponds to, for example, the signal transmission device 200 described previously, and is a semiconductor integrated circuit device that transmits a pulse signal from a primary circuit system (VCC1-GND1 system) to a secondary circuit system (VCC2-GND2 system) while isolating between them in direct-current terms.

The pulse drive circuit 410 pulse-drives the transformer 420 by being fed with a transmission pulse signal Sin output from an unillustrated pulse transmission circuit (see, e.g., the pulse transmission circuit 211 described previously). In terms of what is shown in the diagram, the pulse drive circuit 410 includes a buffer 411 and a transistor 412.

The buffer 411 is fed with the transmission pulse signal Sin to drive the gate of the transistor 412. The buffer 411 can be understood to be the buffer 212 described previously. In that case, the transmission pulse signal Sin can be understood to be the transmission pulse signal S11. Or the buffer 411 can be understood to be the buffer 213 described previously. In that case, the transmission pulse signal Sin can be understood to be the transmission pulse signal S21 described previously.

The transistor 412 is, for example, a P-channel field-effect transistor. The drain (corresponding to a first main terminal) of the transistor 412 is connected to the primary coil 421 of the transformer 420. The source (corresponding to a second main terminal) of the transistor 412 is connected to a supply potential terminal (i.e., an application terminal for a supply voltage VCC1). The gate (corresponding to a control terminal) of the transistor 412 is connected to the output terminal of the buffer 411.

The transistor 412 can be replaced with a pnp bipolar transistor. In that case, the first main terminal mentioned above can be read as "collector" instead of "drain," the second main terminal can be read as "emitter" instead of "source," and the control terminal can be read as "base" instead of "gate."

The transformer 420 has a primary coil 421 and a secondary coil 422 that are magnetically coupled together. The transformer 420 can be understood to be the transformer 231 described previously. In that case the primary and secondary coils 421 and 422 can be understood to be the primary and secondary coils 231*p* and 231*s* described previously. Or the transformer 420 can be understood to be the transformer 232 described previously. In that case the primary and secondary coils 421 and 422 can be understood to be the primary and secondary coils 232*p* and 232*s* described previously.

When the transistor 412 turns from off to on, a primary voltage Vp applied to the primary coil 421 of the transformer 420 rises to a value close to the supply voltage VCC1, and thus a primary current Ip passes across the primary coil 421. This induces, in the secondary coil 422 of the transformer 420, a secondary voltage Vs (corresponding to a reception pulse signal) that corresponds to the primary voltage Vp. According to the secondary voltage Vs just mentioned, an unillustrated pulse reception circuit (see, for example, the pulse reception circuit 223 described previously) provided in a stage succeeding the secondary coil 422 generates an output pulse signal.

As in what is shown in FIG. 1, the pulse drive circuit 400 can have sealed in a single package a first chip with a pulse transmission circuit (unillustrated) and the pulse drive circuit 410 integrated in it, a second chip with a pulse reception circuit (unillustrated) integrated in it, and a third chip with the transformer 420 integrated in it.

With the pulse drive circuit 410 of this comparative example, turning the transistor 412 on and off according to the transmission pulse signal Sin permits the transformer 420 to be pulse-driven.

Inconveniently, in this comparative example, the primary voltage Vp has a relatively high peak value. This leaves room for improvement in terms of noise reduction during pulse driving.

Pulse Drive Circuit (First Embodiment)

Figure 11:
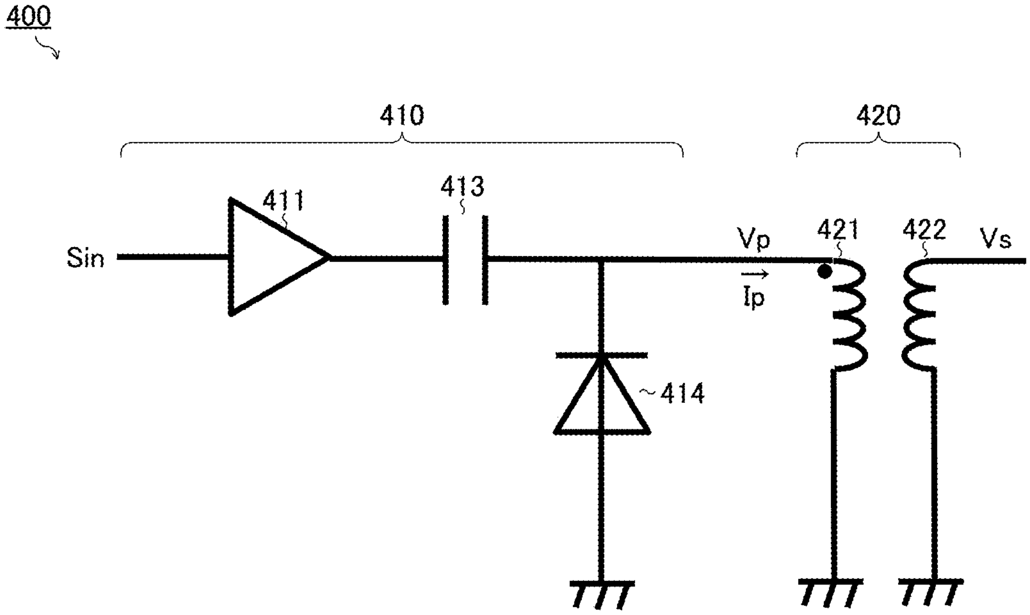
FIG. 11 is a diagram showing a pulse drive circuit according to a first embodiment.

FIG. 11 is a diagram showing a pulse drive circuit according to a first embodiment. The pulse drive circuit 410 of this embodiment is based on the practical example (FIG. 10) described previously and includes, instead of the transistor 412 described previously, a capacitor 413 and a diode 414. Accordingly, for such components as have already been described, the same reference signs as in FIG. 10 will be used and no overlapping description will be repeated, the following description focusing on the features distinctive to this embodiment.

The capacitor 413 is provided between the output terminal of the buffer 411 and the primary coil 421 of the transformer 420.

The diode 414 (corresponding to a first diode) is provided between the primary coil 421 of the transformer 420 and a reference potential terminal (e.g., a ground potential terminal).

In terms of what is shown in the diagram, interconnections are as follows. The first terminal of the capacitor 413 is connected to the output terminal of the buffer 411. The anode of the diode 414 is connected to the reference potential terminal. The second terminal of the capacitor 413 and the cathode of the diode 414 are both connected to the primary coil 421 of the transformer 420.

Thus, the pulse drive circuit 410 of this embodiment includes an LC series circuit composed of the capacitor 413 and the primary coil 421.

Driving the transformer 420 with the primary current Ip passing across such an LC series circuit helps suppress the instantaneous variation rate di/dt of the primary current Ip and thus helps reduce noise during pulse driving.

Figure 12:
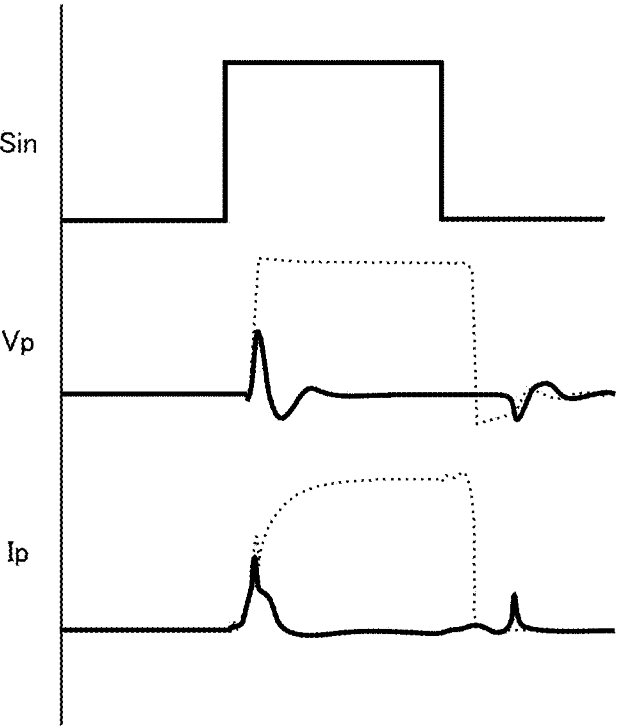
FIG. 12 is a diagram showing a transmission pulse signal, a primary voltage, and a primary current (comparative example versus first embodiment).

FIG. 12 is a diagram showing the transmission pulse signal Sin, the primary voltage Vp, and the primary current Ip (comparative example versus first embodiment). For each of the primary voltage Vp and the primary current Ip, a solid line represents the behavior in the first embodiment (FIG. 11) and a broken line represents the behavior in the comparative example (FIG. 10).

As will be understood from the diagram, with the pulse drive circuit 410 of this embodiment, it is possible to reduce the peak value of the primary voltage Vp as compared with the comparative example described previously. This results in a reduced peak value of the primary current Ip as well, and it is thus possible to reduce noise during pulse driving (i.e., achieve low EMI [electromagnetic interference]).

In the comparative example described previously, the primary current Ip passes constantly during the high-level period of the transmission pulse signal Sin. By contrast, in the pulse drive circuit 410 of the first embodiment, the primary current Ip passes only at the time when the transmission pulse signal Sin switches logic levels. It is thus possible also to reduce power consumption during pulse driving.

Figure 13:
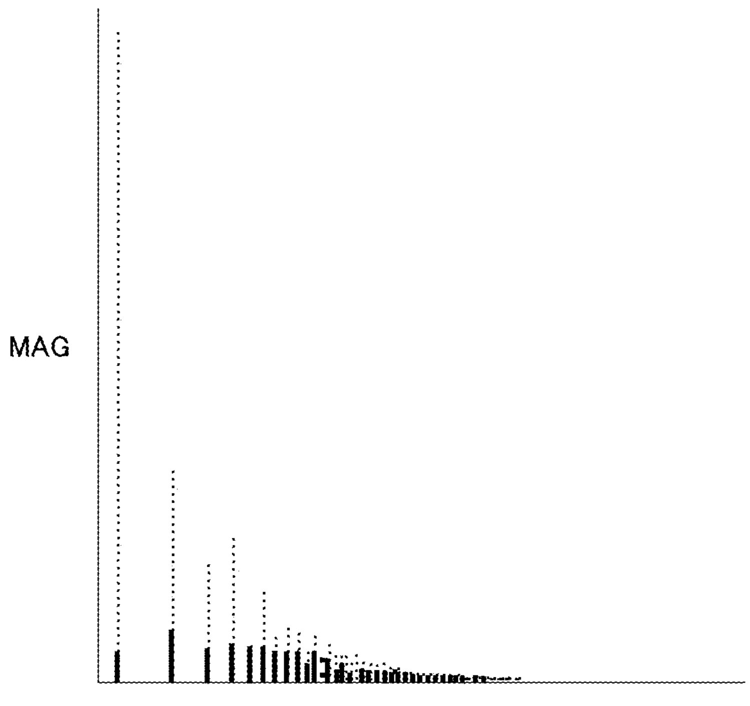
FIG. 13 is a diagram showing a result of discrete Fourier transform on the primary current (comparative example versus first embodiment).

FIG. 13 is a diagram showing a result of discrete Fourier transform on the primary current Ip (comparative example versus first embodiment). In the diagram, the horizontal axis represents frequency and the vertical axis represents intensity. In the diagram, a solid line represents the behavior in the first embodiment (FIG. 11) and a broken line represents the behavior in the comparative example (FIG. 10).

As will be understood from the diagram, the pulse drive circuit 410 of this embodiment exhibits reduced spectrum intensities as compared with the comparative example described previously. That is, it achieves reduced noise during pulse driving (low EMI).

Pulse Drive Circuit (Second Embodiment)

Figure 14:
FIG. 14 is a diagram showing a pulse drive circuit according to a second embodiment.
Figure 14:
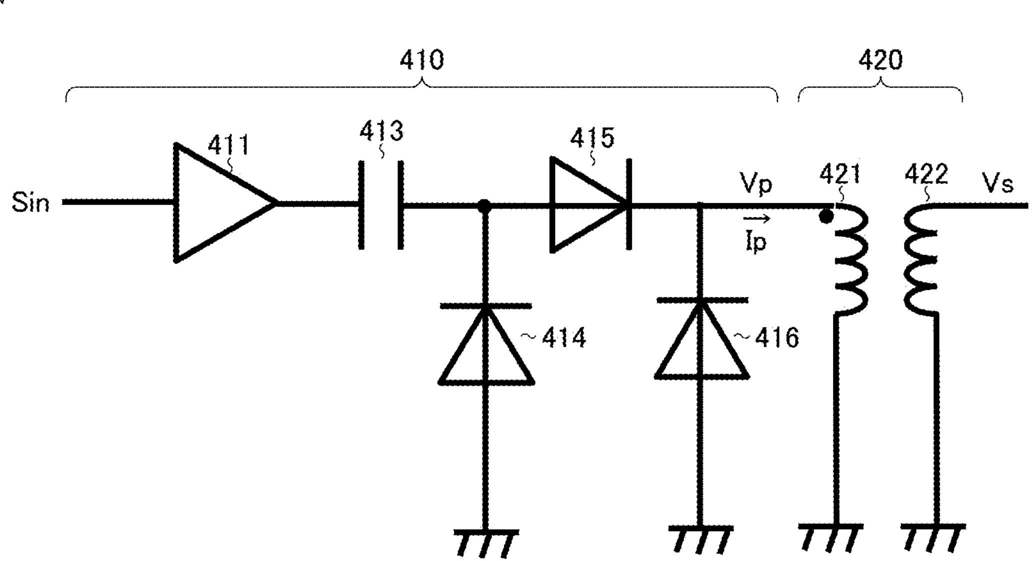

FIG. 14 is a diagram showing a pulse drive circuit according to a second embodiment. The pulse drive circuit 410 of this embodiment is based on the first embodiment (FIG. 11) described previously and further includes diodes 415 and 416. Accordingly, for such components as have already been described, the same reference signs as in FIG. 11 will be used and no overlapping description will be repeated, the following description focusing on the features distinctive to this embodiment.

The diode 415 (corresponding to a second diode) is provided between the capacitor 413 and the primary coil 421. The diode 416 (corresponding to a third diode) is connected between the reference potential terminal and the primary coil 421.

In terms of what is shown in the diagram, the second terminal of the capacitor 413 and the cathode of the diode 414 are both connected to the anode of the diode 415. The cathodes of the diodes 415 and 416 are both connected to the primary coil 421 of the transformer 420. The anode of the diode 416 is connected to the reference potential terminal.

Thus, in the pulse drive circuit 410 of this embodiment, the LC series circuit mentioned previously further includes the diodes 415 and 416.

Figure 15:
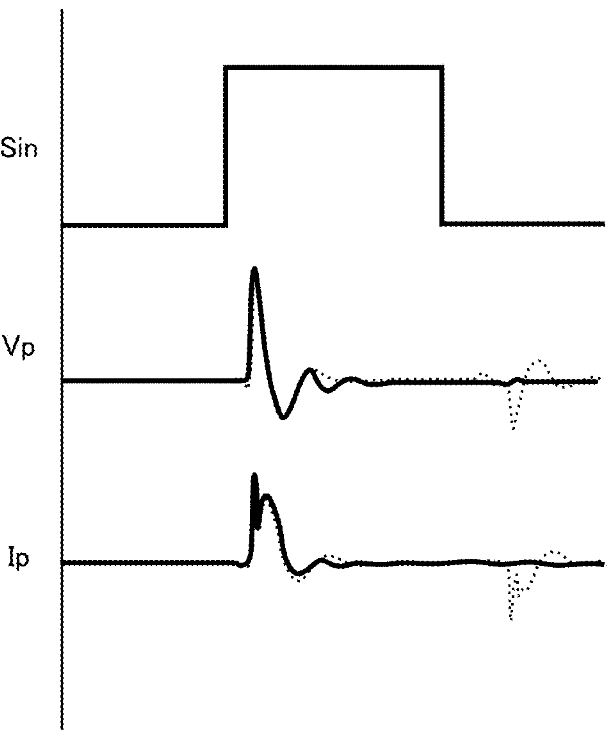
FIG. 15 is a diagram showing a transmission pulse signal, a primary voltage, and a primary current (first embodiment versus second embodiment).

FIG. 15 is a diagram showing the transmission pulse signal Sin, the primary voltage Vp, and the primary current Ip (first embodiment versus second embodiment). For each of the primary voltage Vp and the primary current Ip, a solid line represents the behavior in the second embodiment (FIG. 14) and a broken line represents the behavior in the first embodiment (FIG. 11).

As shown in the diagram, with the pulse drive circuit 410 of this embodiment, a reverse flow of the primary current Ip in response to a jump-up of the primary voltage Vp is suppressed as compared with the first embodiment described previously. It is thus possible to prevent ringing of each of the primary voltage Vp and the primary current Ip.

Pulse Drive Circuit (Third Embodiment)

Figure 16:
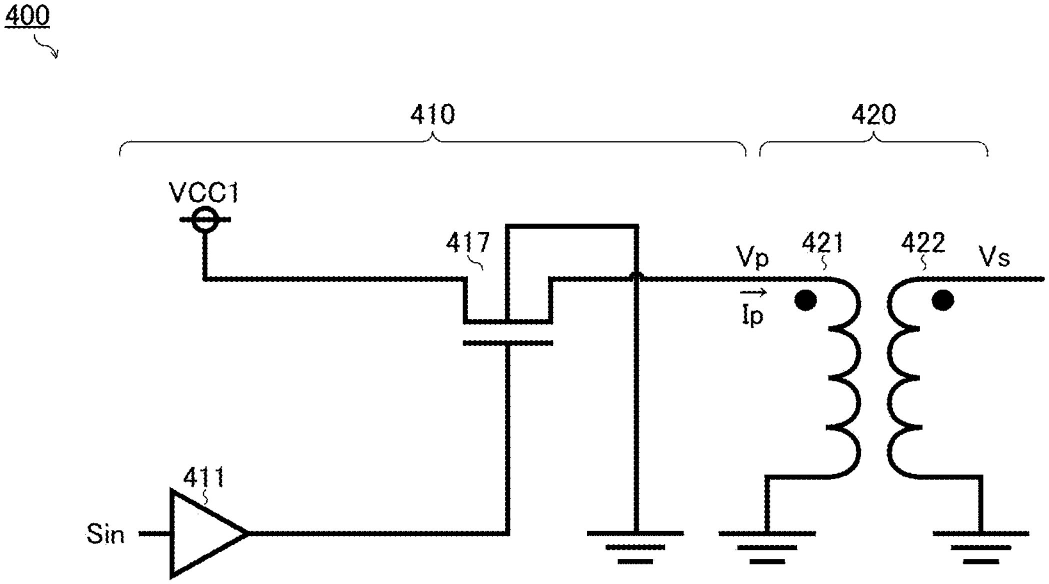
FIG. 16 is a diagram showing a pulse drive circuit according to a third embodiment.

FIG. 16 is a diagram showing a pulse drive circuit according to a third embodiment. The pulse drive circuit 410 of this embodiment is based on the comparative example (FIG. 10) described previously and includes, instead of the transistor 412 described previously, a transistor 417. Accordingly, for such components as have already been described, the same reference signs as in FIG. 11 will be used and no overlapping description will be repeated, the following description focusing on the features distinctive to this embodiment.

The transistor 417 is, for example, an N-channel field-effect transistor. The drain (corresponding to the first main terminal) of the transistor 417 is connected to the supply potential terminal (i.e., an application terminal for the supply voltage VCC1), The source (corresponding to the second main terminal) of the transistor 417 is connected to the primary coil 421 of the transformer 420. The gate (corresponding to the control terminal) of the transistor 417 is connected to the output terminal of the buffer 411. The back gate of the transistor 417 is connected to the reference potential terminal (e.g., the ground potential terminal).

The transistor 417 can be replaced with an npn bipolar transistor. In that case, the first main terminal mentioned above can be read as "collector" instead of "drain", the second main terminal can be read as "emitter" instead of "source," and the control terminal can be read as "base" instead of "gate."

With the pulse drive circuit 410 of this embodiment, when the primary voltage Vp jumps up, the gate-source voltage VGS of the transistor 417 lowers and hence the conductance of the transistor 417 lowers (its on-resistance increases). It is thus possible to keep the primary current Ip low with no need for special control, and hence to achieve reduced noise (low EMI).

In the pulse drive circuit 410 of this embodiment, the back gate of the transistor 417 is connected to the reference potential terminal (e.g., the ground potential terminal). With this circuit configuration, if an ESD (electrostatic discharge) surge is applied to an application terminal for the primary voltage Vp (i.e., a pad PAD connected to the primary coil 421 of the transformer 420), an unexpected fault may result.

Figure 17:
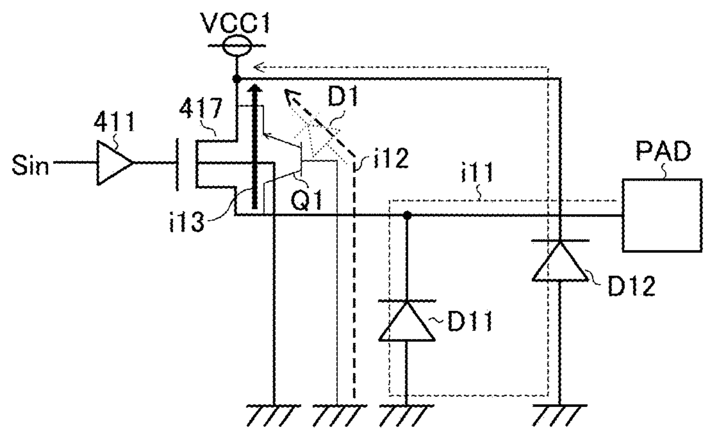
FIG. 17 is a diagram showing a problem resulting from application of a positive surge.

FIG. 17 is a diagram showing the problem resulting from application of a positive surge to the pad PAD. In the diagram, between the pad PAD leading to the source of the transistor 417 and the reference potential terminal (i.e., the ground potential terminal) and between the supply potential terminal (i.e., the application terminal for the supply voltage VCC1) and the reference potential terminal are connected electrostatic protection diodes D11 and D12 respectively.

The transistor 417 is accompanied by an npn parasitic transistor Q1 of which the emitter is the drain of the transistor 417, of which the collector is the source of the transistor 417, and of which the base is the back gate of the transistor 417 (i.e., the reference potential terminal). Put another way, the transistor 417 is accompanied by a parasitic diode D1 of which the cathode is the drain of the transistor 417 and of which the anode is the back gate of the transistor 417 (i.e., the reference potential terminal).

If a positive ESD surge is applied to the pad PAD, a current passes across a path i11 via the electrostatic protection diodes D11 and D12 (see the short-stroke broken-line arrow, leading from PAD to D11 to GND to D12 to VCC1). This is nothing but electrostatic protection operation as expected and poses no problem.

Inconveniently, however, a current passing across the path i11 augments the potential difference between the pad PAD and the reference potential terminal. As a result, the parasitic diode D1 present between the back gate and the drain of the transistor 417 is forward-biased and thus a current can pass across a path i12 via the parasitic diode D1 (see the long-stroke broken-line arrow, leading from GND to D1 to VCC1).

A current passing across the path i12 may turn on the parasitic transistor Q1 present between the drain and the source of the transistor 417, and thus a current may pass across a path i13 via the parasitic transistor Q1 (see the solid-line arrow, leading from GND to Q1 to VCC1).

Figure 18:
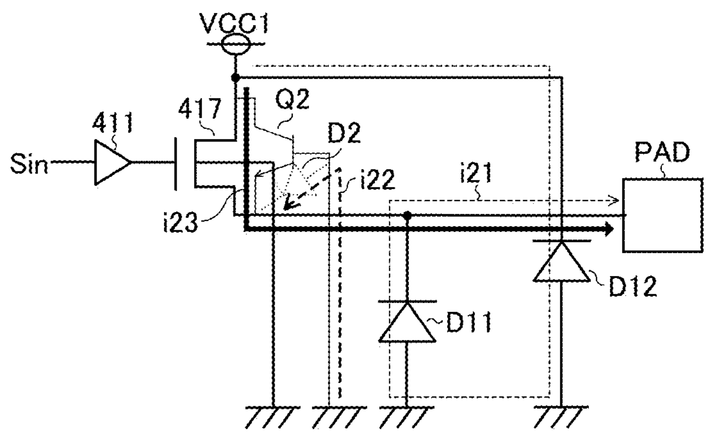
FIG. 18 is a diagram showing a problem resulting from application of a negative surge.

FIG. 18 is a diagram showing the problem resulting from application of a negative surge to the pad PAD. In the diagram, as in FIG. 17 referred to previously, between the pad PAD leading to the source of the transistor 417 and the reference potential terminal (i.e., the ground potential terminal) and between the supply potential terminal (i.e., the application terminal for the supply voltage VCC1) and the reference potential terminal are connected electrostatic protection diodes D11 and D12 respectively.

Moreover, the transistor 417 is accompanied by an npn parasitic transistor Q2 of which the collector is the drain of the transistor 417, of which the emitter is the source of the transistor 417, and of which the base is the back gate of the transistor 417 (i.e., the reference potential terminal). Put another way, the transistor 417 is accompanied by a parasitic diode D2 of which the cathode is the source of the transistor 417 and of which the anode is the back gate of the transistor 417 (i.e., the reference potential terminal).

If a negative ESD surge is applied to the pad PAD, a current passes across a path i21 via the electrostatic protection diodes D11 and D12 (see the short-stroke broken-line arrow, leading from VCC1 to D12 to GND to D11 to PAD). This is nothing but electrostatic protection operation as expected and poses no problem.

Inconveniently, however, a current passing across the path i21 augments the potential difference between the pad PAD and the reference potential terminal. As a result, the parasitic diode D2 present between the back gate and the source of the transistor 417 is forward-biased and thus a current can pass across a path i22 via the parasitic diode D2 (see the long-stroke broken-line arrow, leading from GND to D2 to PAD).

A current passing across the path i22 may turn on the parasitic transistor Q2 present between the drain and the source of the transistor 417, and thus a current may pass across a path i23 via the parasitic transistor Q2 (see the solid-line arrow, leading from VCC1 to Q2 to GND).

Pulse Drive Circuit (Fourth Embodiment)

Figure 19:
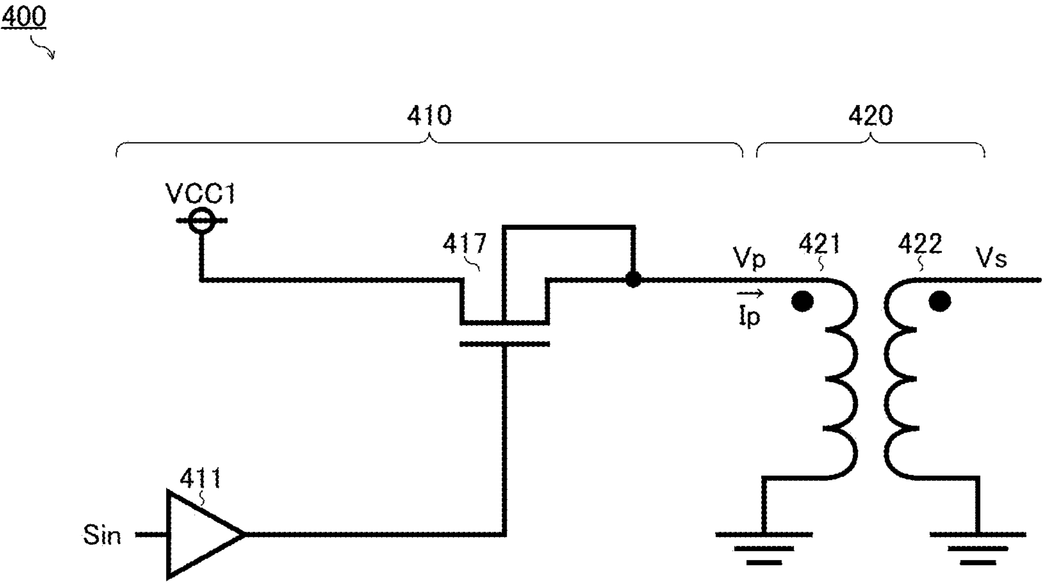
FIG. 19 is a diagram showing a pulse drive circuit according to a fourth embodiment.

FIG. 19 is a diagram showing a pulse drive circuit according to a fourth embodiment. The pulse drive circuit 410 of this embodiment is based on the third embodiment (FIG. 16) described previously but has the back gate of the transistor 417 connected to a different destination.

In terms of what is shown in the diagram, the back gate of the transistor 417 is connected not to the reference potential terminal (i.e., the ground potential terminal) but to the source of the transistor 417.

With this circuit configuration, even if an ESD surge is applied to the application terminal for the primary voltage Vp (i.e., the pad PAD connected to the primary coil 421 of the transformer 420), the parasitic transistors Q1 and Q2 do not turn on. This makes unexpected faults unlikely.

Pulse Drive Circuit (Fifth Embodiment)

Figure 20:
FIG. 20 is a diagram showing a pulse drive circuit according to a fifth embodiment.
Figure 20:
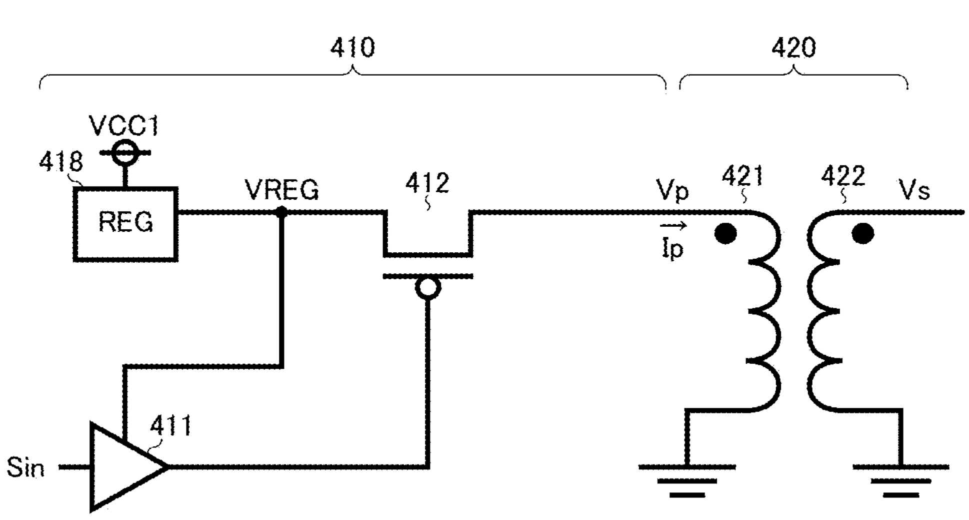

FIG. 20 is a diagram showing a pulse drive circuit according to a fifth embodiment. The pulse drive circuit 410 of this embodiment is based on the comparative example (FIG. 10) described previously and further includes a regulator 418. Accordingly, for such components as have already been described, the same reference signs as in FIG. 11 will be used and no overlapping description will be repeated, the following description focusing on the features distinctive to this embodiment.

The regulator 418 generates an internal supply voltage VREG (e.g., 3.3 V) lower than the supply voltage VCC1 (e.g., 5 V). The regulator 418 can be implemented with, for example, a linear regulator.

The source of the transistor 412 is connected not to the supply potential terminal (the application terminal for the supply voltage VCC1) but to an application terminal for the internal supply voltage VREG.

Moreover, the buffer 411 is fed with, as its driving voltage, the internal supply voltage VREG.

The pulse drive circuit 410 of this embodiment operates with a reduced driving voltage for the transformer 420 (i.e., a reduced peak value of the primary voltage Vp) as compared with the comparative example described previously. It thus achieves reduced noise during pulse driving (low EMI) and reduced power consumption.

Pulse Drive Circuit (Sixth Embodiment)

Figure 21:
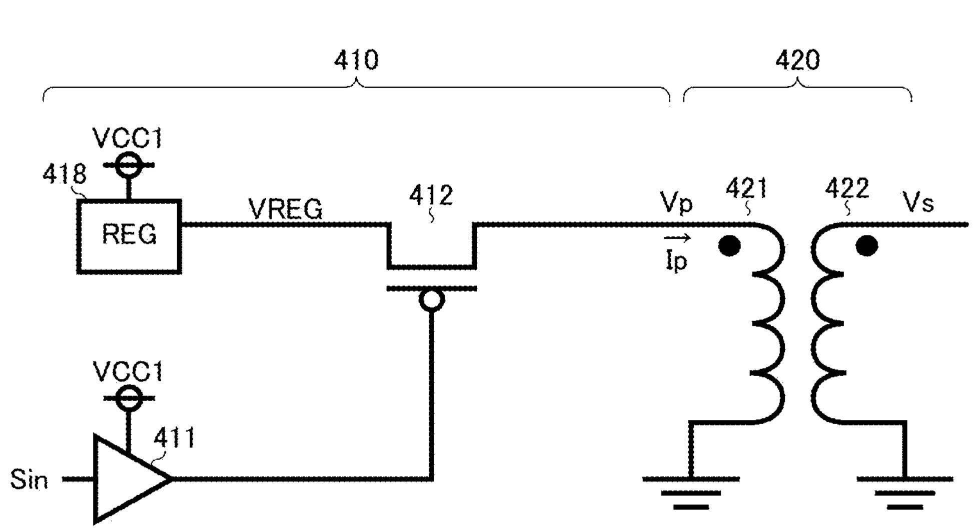
FIG. 21 is a diagram showing a pulse drive circuit according to a sixth embodiment.

FIG. 21 is a diagram showing a pulse drive circuit according to a sixth embodiment. The pulse drive circuit 410 of this embodiment is based on the fifth embodiment (FIG. 20) described previously but uses a different driving voltage for the buffer 411.

Specifically, in terms of what is shown in the diagram, the buffer 411 is fed with, as its driving voltage, the supply voltage VCC1. That is, electric power is not supplied from the regulator 418 to the buffer 411. In other words, the regulator 418 has only to have a current supply capacity to output a primary current Ip high enough to pulse-drive the transformer 420.

The pulse drive circuit 410 of this embodiment does not require an unnecessary increase in the current supply capacity of the regulator 418 as in the fifth embodiment described previously. It is thus possible to reduce the circuit scale of the regulator 418.

Overview

To follow is an overview of the different embodiments described above.

According to one aspect of what is disclosed herein, a pulse drive circuit includes: a buffer configured to receive a transmission pulse signal; a capacitor configured to be provided between the output terminal of the buffer and the primary coil of a transformer; and a first diode configured to be provided between the primary coil of the transformer and a reference potential terminal. (A first configuration.)

The pulse drive circuit of the first configuration described above can further include: a second diode configured to be provided between the capacitor and the primary coil; and a third diode configured to be provided between the reference potential terminal and the primary coil. (A second configuration.)

In the pulse drive circuit of the second configuration described above, the first terminal of the capacitor can be connected to the output terminal of the buffer, the anode of the first diode and the anode of the third diode can both be connected to the reference potential terminal, the second terminal of the capacitor and the cathode of the first diode can both be connected to the anode of the second diode, and the cathode of the second diode and the cathode of the third diode can both be connected to the primary coil of the transformer. (A third configuration.)

According to another aspect of what is disclosed herein, a pulse drive circuit includes: a buffer configured to receive a transmission pulse signal; an N-channel or npn transistor configured to have a control terminal connected to the output terminal of the buffer, a first main terminal connected to a supply potential terminal, and a second main terminal connected to the primary coil of a transformer. (A fourth configuration.)

In the pulse drive circuit of the fourth configuration described above, the transistor can be of an N-channel type and the back gate of the transistor can be connected to the reference potential terminal. (A fifth configuration.)

In the pulse drive circuit of the fourth configuration described above, the transistor can be of an N-channel type and the back gate of the transistor can be connected to the second main terminal of the transistor. (A sixth configuration.)

According to yet another aspect of what is disclosed herein, a pulse drive circuit includes: a buffer configured to receive a transmission pulse signal; a regulator configured to generate an internal supply voltage lower than a supply voltage; and an P-channel or pnp transistor configured to have a control terminal connected to the output terminal of the buffer, a first main terminal connected to the primary coil of a transformer, and a second main terminal connected to an application terminal for the internal supply voltage. (A seventh configuration.)

In the pulse drive circuit of the seventh configuration described above, the buffer can be fed with the internal supply voltage as a driving voltage. (An eighth configuration.)

In the pulse drive circuit of the seventh configuration described above, the buffer can be fed with the supply voltage as a driving voltage. (A ninth configuration.)

According to still another aspect of what is disclosed herein, a signal transmission device includes: a pulse transmission circuit configured to generate the transmission pulse signal according to an input pulse signal; the pulse drive circuit according to any of the first to ninth configurations described above; the transformer; and a pulse reception circuit configured to generate an output pulse signal according to a reception pulse signal appearing in the secondary coil of the transformer. (A tenth configuration.)

The signal transmission device of the tenth configuration described above can have sealed in a single package a first chip having the pulse transmission circuit and the pulse drive circuit integrated in it, a second chip having the pulse reception circuit integrated in it, and a third chip having the transformer integrated in it. (An eleventh configuration.)

According to the present disclosure, it is possible to provide a pulse drive circuit that can reduce noise during pulse driving, and to a signal transmission device employing such a pulse drive circuit.

<Further Modifications>

The various technical features disclosed herein may be implemented in any manners other than as in the embodiments described above, and allow for many modifications without departure from the spirit of their technical ingenuity. That is, the embodiments described above should be understood to be in every aspect illustrative and not restrictive, and the technical scope of the present disclosure should be understood to be defined by the appended claims and encompasses any modifications within a scope equivalent in significance to what is claimed.

The invention claimed is:

1. A pulse drive circuit comprising:

a buffer configured to receive a transmission pulse signal;

a capacitor between an output terminal of the buffer and a primary coil of a transformer;

a first diode between the primary coil of the transformer and a reference potential terminal;

a second diode between the capacitor and the primary coil; and a third diode between the reference potential terminal and the primary coil.

2. The pulse drive circuit according to claim 1, wherein a first terminal of the capacitor is connected to the output terminal of the buffer, an anode of the first diode and an anode of the third diode are both connected to the reference potential terminal, a second terminal of the capacitor and a cathode of the first diode are both connected to an anode of the second diode, and a cathode of the second diode and a cathode of the third diode are both connected to the primary coil of the transformer.

3. A signal transmission device comprising:

a pulse transmission circuit configured to generate the transmission pulse signal according to an input pulse signal;

the pulse drive circuit according to claim 1;

the transformer; and a pulse reception circuit configured to generate an output pulse signal according to a reception pulse signal appearing in a secondary coil of the transformer.

4. The signal transmission device according to claim 3, wherein a first chip having the pulse transmission circuit and the pulse drive circuit integrated therein, a second chip having the pulse reception circuit integrated therein, and a third chip having the transformer integrated therein are sealed in a single package.

* * * * *